US011030985B2

(12) United States Patent
Nolan et al.

(10) Patent No.: US 11,030,985 B2
(45) Date of Patent: Jun. 8, 2021

(54) MUSICAL INSTRUMENT SPECIAL EFFECTS DEVICE

(71) Applicants: Shane C. Nolan, Buffalo, NY (US); Ryan Jaquin, Buffalo, NY (US); Alexander Schwartz, Buffalo, NY (US); Henry Goodman, East Amherst, NY (US)

(72) Inventors: Shane C. Nolan, Buffalo, NY (US); Ryan Jaquin, Buffalo, NY (US); Alexander Schwartz, Buffalo, NY (US); Henry Goodman, East Amherst, NY (US)

(73) Assignee: ALGORHYTHM TECHNOLOGIES INC., Amherst, NY (US)

( * ) Notice: Subject to any disclaimer, the term of this patent is extended or adjusted under 35 U.S.C. 154(b) by 0 days.

(21) Appl. No.: 16/698,693

(22) Filed: Nov. 27, 2019

(65) Prior Publication Data

US 2020/0202826 A1 Jun. 25, 2020

Related U.S. Application Data

(60) Provisional application No. 62/771,813, filed on Nov. 27, 2018.

(51) Int. Cl.
*H03G 3/00* (2006.01)
*G10H 1/00* (2006.01)
*G10H 1/34* (2006.01)

(52) U.S. Cl.
CPC .......... *G10H 1/0091* (2013.01); *G10H 1/342* (2013.01); *G10H 2210/155* (2013.01); *G10H 2220/295* (2013.01)

(58) Field of Classification Search
CPC ........................................................ H03G 3/00
See application file for complete search history.

(56) References Cited

U.S. PATENT DOCUMENTS 6,353,169 B1 * 3/2002 Juszkiewicz ......... G10H 1/0058 369/4
7,982,124 B1 * 7/2011 Landis ..................... G10H 3/18 84/727
8,748,724 B1 * 6/2014 Harmon ................... G10H 1/02 84/737
9,940,915 B2 4/2018 Guo
10,007,501 B1 6/2018 Zhang et al.
2003/0196542 A1 * 10/2003 Harrison, Jr. ............ G04G 9/06 84/737
2006/0272489 A1 * 12/2006 Remignanti ......... G10H 1/0091 84/723
2007/0234880 A1 * 10/2007 Adams ................... G10H 3/186 84/601
2009/0100988 A1 * 4/2009 Villa .................... G10H 1/0091 84/601
2010/0269670 A1 * 10/2010 O'Connor ............. G10H 1/348 84/626

(Continued)

*Primary Examiner* — Olisa Anwah
(74) *Attorney, Agent, or Firm* — Simpson & Simpson PLLC

(57) ABSTRACT

A musical instrument special effects device, comprising a special effects unit connected by wire between the musical instrument and an output device, where the unit is operatively arranged to selectively produce at least one of a plurality of preprogrammed special audio effects; and a controller is operatively arranged to wirelessly control the special effects unit.

9 Claims, 26 Drawing Sheets

(56) References Cited

U.S. PATENT DOCUMENTS

| | | | | |
|---|---|---|---|---|
| 2013/0034240 | A1 * | 2/2013 | Crawford | G10H 3/186<br>381/77 |
| 2013/0182861 | A1 * | 7/2013 | Kapp | G10H 1/0091<br>381/61 |
| 2013/0263721 | A1 * | 10/2013 | Shavit | G10H 3/186<br>84/626 |
| 2014/0123838 | A1 * | 5/2014 | D'Amours | G10H 1/0083<br>84/626 |
| 2015/0040744 | A1 * | 2/2015 | Redding | G10H 3/18<br>84/726 |
| 2016/0314772 | A1 * | 10/2016 | Alstad | G10H 1/348 |
| 2018/0247618 | A1 * | 8/2018 | Walker | G10H 1/0555 |
| 2019/0104361 | A1 * | 4/2019 | Abel | H04R 3/02 |

* cited by examiner

AUDIO SIGNAL DIAGRAM

MUSICAL INSTRUMENT SPECIAL EFFECTS DEVICE

FIELD

The invention relates generally to electric instruments, more specifically to guitars, and, even more specifically, to a wirelessly controlled special effects device.

COMPUTER PROGRAM LISTING APPENDIX

The present application includes a computer program listing appendix. The computer program listing is intended to comprise a part of the complete written description of the invention pursuant to 35 U.S.C. § 112. The software code of the program is as follows:

```
//Date: 11/26/2019
//Title: NLNP103US CODE
//By: Shane Nolan
//Deasription: Processor in effects unit receives input from wireless receiver (from user) and
activates one effect (bitcrush effect).
//Programming Language: Arduino
const int analogInPin = A0; // Analog input pin that the pre-amp is attached to
int sensorValue = 0;        // audio signal value received from the Pre-Amp
int outputValue = 0;        // value output to the PWM (analog out)
int state = 0;       // Initial state for wireless receiver
void setup( ) {
    Serial.begin(38400);       // initialize serial communications at 38400 bps:
    analogWriteResolution(12);        // resoloution for DAC
    pinMode(13, OUTPUT);       // pin 13 is analog output
    pinMode(1, INPUT);         // pin 1 is analog input
}
void loop( ) {
    if(Serial.available( ) > 0){ // Checks whether data is comming from the serial line from the
wireless receiver
        state = Serial.read( ); // Reads the data from the serial line
}
if (state == '0') {
    digitalWrite(1, LOW); // Turn effect_1 OFF
    state = 0;
}
else if (state == '1') {
    digitalWrite(1, HIGH);// Activate effect_1
    state = 0;
}
    sensorValue = analogRead(analogInPin); // read the analog in value:
    outputValue = sensorValue;
    //Apply effect 'Bitcrush' effect
    int effect_1 = digitalRead(1);
    if (effect_1 == HIGH) {
        outputValue >>= 4;       // bit shift
        outputValue <<= 4;       // bit 'crush'
        digitalWrite(13, HIGH);
    }
    else {
        digitalWrite(13, LOW);         // ignore if pin 13 is off
    }
    analogWrite(A14, outputValue); // write to the DAC
}
```

| Name | Date Created | Size |
|---|---|---|
| ardunio.txt | Nov. 26, 2019 | 2 KB |

BACKGROUND

Typically, signal modelling from the output of an electrical instrument occurs via a program executed by off-board panels or an external device such as a desktop computer. These instruments are usually connected via a cable to the external device and then to sound amplifier.

An electric guitar is a guitar that uses one or more pickups to convert the vibration of its strings into electrical signals. The vibration occurs when a guitar player strums, plucks, fingerpicks, slaps or taps the strings. The pickup generally uses electromagnetic induction to create this signal, which being relatively weak is fed into an amplifier before being sent to the speaker(s), which converts it into audible sound.

Traditionally, the electronic guitar uses a foot pedal in order to activate special effects from an instrument. The foot pedal is a toggle switch between two sounds. In order to produce a plurality of special sound effects multiple pedals are needed. Pedals are classified by the special effects they produce such as:

Dynamic effects either change overall volume or tame volume variations and are of two varieties, compressor effect or boost effect.

Drive pedals provide a boost in the gain to create a crunchy rock tone. The gain boost is divided into three subcategories, overdrive, distortion, and fuzz.

Modulation effects change the pitch or frequency parameters of a sound. The most common types of modulation effects are phaser, flanger, chorus, and octaver.

Delay effects are a much longer delay than the modulation effects and also provide repeating delayed notes or several instances of the same sound being played back at a predetermined delay, i.e. an echo.

Reverb effects essentially simulate the sounds of different spaces.

Filter effects filter out specific frequencies of a sound.

All of the abovementioned examples require individual hardware to be connected to the instrument. A musician still has to continually toggle each individual pedal or combination of pedals in order to produce the desired audio special effect. The transition to a different special effect requires the musician to toggle off all of the previously selected pedals. This process restricts a performance as the pedals are confined to a single area and additionally requires extra navigation to properly toggle the desired pedals.

To assist the musician with organizing all of the needed hardware, frequently a pedalboard is employed. A guitar pedalboard is a flat board or panel which serves as a container, patch bay and power supply for effects pedals for the electric guitar. Some pedalboards contain their own transformer and power cables, in order to power a number of different pedals. Pedalboards assist the player in managing multiple pedals. Although the pedalboard helps organize all the special effects hardware, there is a need to consolidate the various special effects hardware into a single special effects unit and a single controller.

Thus, there is a long-felt need for an electrical instrument, e.g., a guitar that is connectable to a device, contained within the cable itself, which may be wirelessly programmed to produce special effects from that instrument.

SUMMARY

Broadly, the invention comprises a musical instrument special effects device, having a special effects unit connected by wire between the musical instrument and an output device, the unit operatively arranged to selectively produce at least one of a plurality of preprogrammed special audio effects, and, a controller operatively arranged to wirelessly control the special effects unit.

In a preferred embodiment, the controller is attached to the musical instrument, the instrument strap, or fixed to a music/microphone stand. The system of the invention includes built-in special effects modules that are configurable by the musician on the controller device itself (e.g., by way of push buttons to select desired preprogrammed special effects). This gives the musician the flexibility associated with software-based effects that run on a phone/PC, but in an ultra-compact hardware platform. The accompanying phone/PC application is operatively arranged to configure the special effects unit and to add new effects. Once the unit is configured, the musician does not need to use the software phone/PC application again unless changes or new effects are desired.

A general object of the invention is to provide a special effects device that includes an in-line special effects unit for a musical instrument, which unit is, in turn, programmable by a personal computer (PC) or by an application on a smartphone, which unit is controllable wirelessly by a handheld controller.

Another object of the invention is to provide a special effects device which is easy to use, lightweight, wireless, and portable.

Still another object of the invention is to provide a special effects unit which is preprogrammed with a core set of special effects but may be reprogrammed from an online community of software developers and/or musicians.

Still a further object is to provide a special effects unit that may be used with a variety of musical instruments, including, but not limited to electric guitars, electric-acoustic guitars, bass guitars, vocals (as a microphone accessory), and orchestral instruments.

These and other objects, features, and advantages of the present disclosure will become readily apparent upon a review of the following detailed description of the disclosure, in view of the drawings and appended claims.

BRIEF DESCRIPTION OF THE SEVERAL VIEWS OF THE DRAWINGS

Various embodiments are disclosed, by way of example only, with reference to the accompanying schematic drawings in which corresponding reference symbols indicate corresponding parts, in which:

FIG. 41 is a thirty-first screenshot of the software application;

DETAILED DESCRIPTION OF EMBODIMENTS

Figure 1:
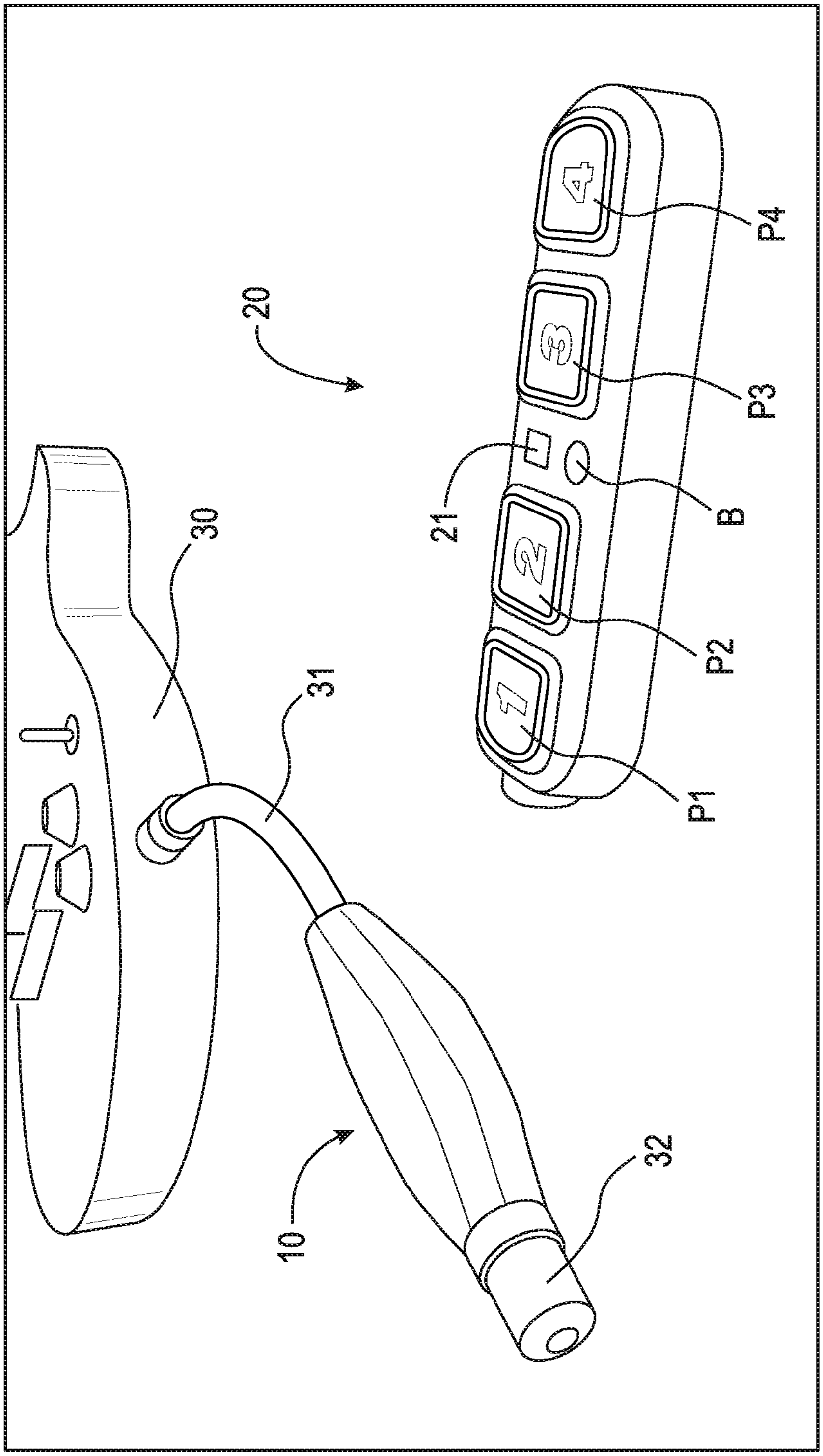
FIG. 1 is a drawing of an example embodiment of the special effects device of the present invention.

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments. It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

Moreover, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

Broadly, the proposed device is a musical instrument electronic special effects unit, preferably located in an instrument cable connected to the instrument, controlled by a wireless controller. In a preferred embodiment, the controller is attached to the musical instrument, the instrument strap, or fixed to a music/microphone stand. The invention includes special effects preprogrammed within the special effects unit that are selectable by the musician on a controller (e.g., by way of push buttons to select desired preprogrammed special effects). This gives the musician the flexibility associated with software-based effects that run on a phone/PC, but in an ultra-compact hardware platform. The accompanying phone/PC application is operatively arranged to configure the special effects on the special effects unit and to add new effects. Once the special effects unit is configured, the musician does not need to use the software phone/PC application again unless changes or new effects are desired.

Adverting to FIG. 1, special effects unit 10 is seen connected in in-line cable 31 connected to guitar 30, with controller 20 shown located proximate the unit. The controller is seen to have a plurality of push buttons P1-P4 to select various preprogrammed effects. In a preferred embodiment controller 20 is in wireless communication with special effects unit 10. In a preferred embodiment controller 20 communicates with unit 10 via Bluetooth® communication although other wireless communication protocols are also suitable such as 2.4-2.5 GHz.

Wireless controller 20 enables the user to turn the desired effects on and off without the need to physically interact with the special effects unit. The wireless controller also allows a user to activate effects and alter the parameters of the effects.

Figure 2:
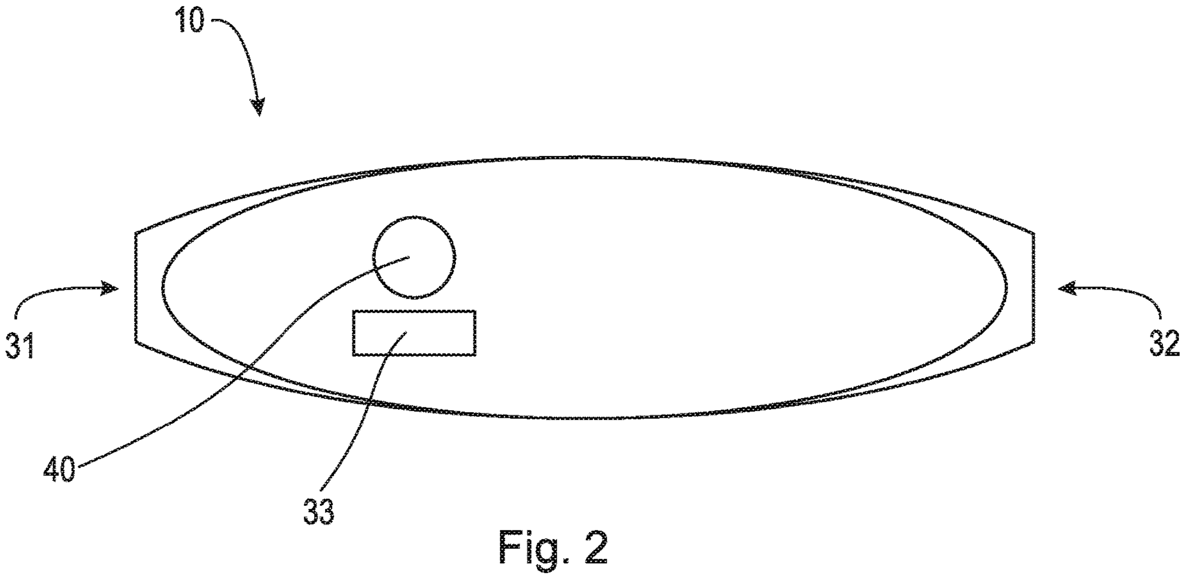
FIG. 2 is a top view of an example embodiment of the special effects device of the present invention.

FIG. 2 shows special effects unit 10 with a preferred embodiment of ¼ inch audio jacks 31 and 32. Audio jack 31 is the musical instrument input to effects unit 10. Audio jack 32 is the output to be connected to a sound making device or amplifier. The audio signal from audio jack 32 has been modified by the selected special effects. Special effects unit 10 has power button 40 and power/data connector 33. Power/data connector 33 in a preferred embodiment is a standard USB connection.

Figure 3:
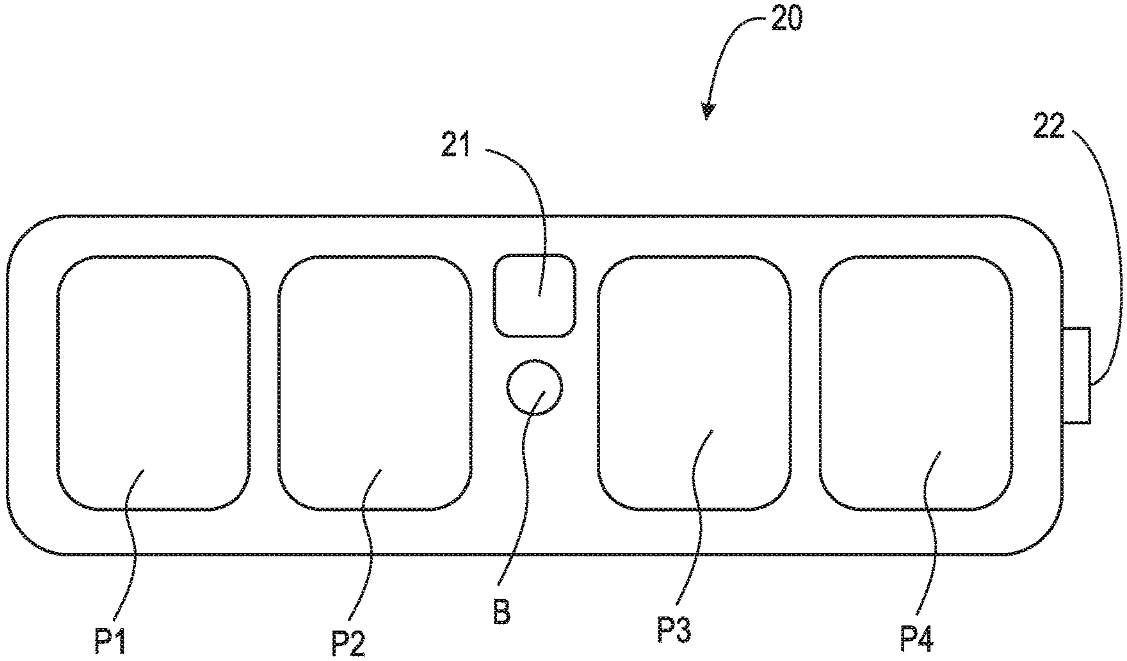
FIG. 3 is a top view of an example embodiment of the controller of the present invention.

FIG. 3 shows wireless controller 20 with a plurality of push-buttons P1-P4 and in a preferred embodiment at least one user selection knob B. Both plurality of push-buttons P1-P4 and at least one user selection knob B allow a user to toggle through desired special effects and preprogrammed special effects bank. Wireless controller 20 includes display 21 that shows the selected bank of special effects a user is accessing. Wireless controller 20 features USB charging port 22 in order to recharge internal battery.

Figure 4:
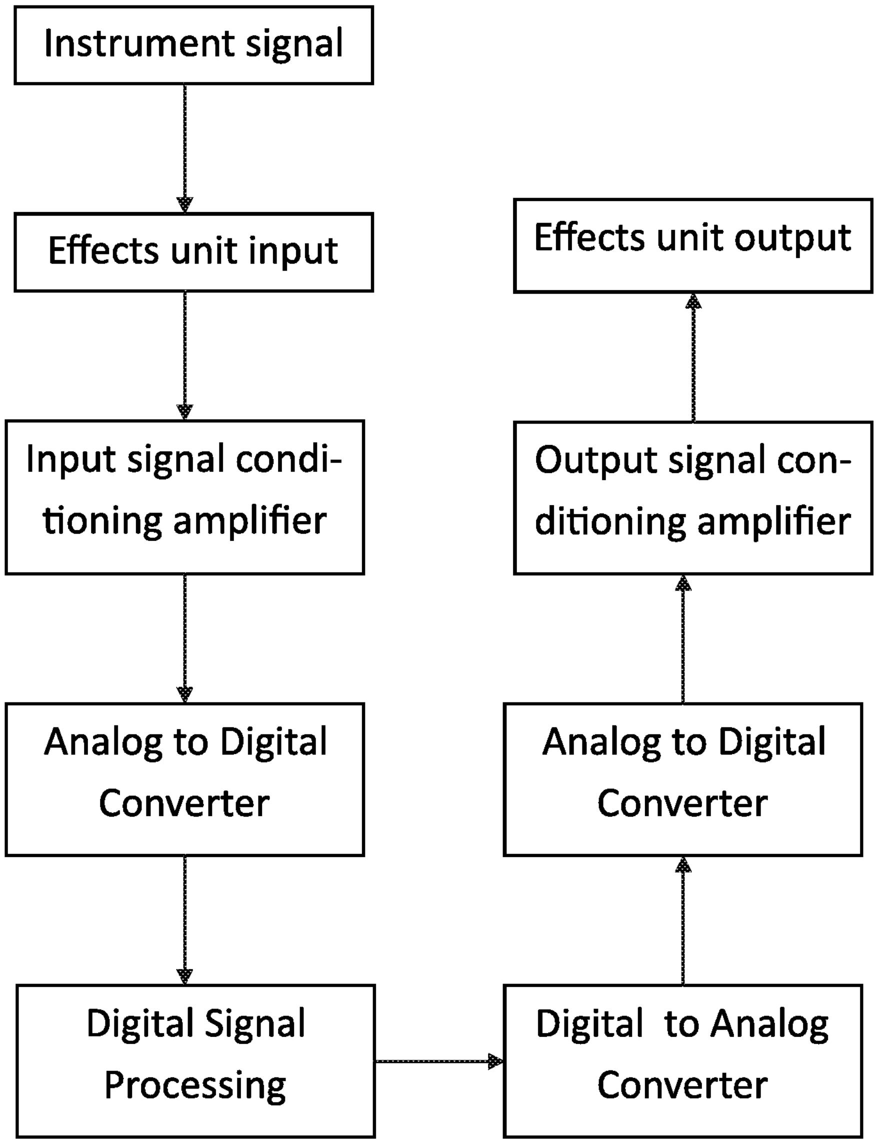
FIG. 4 is a flow chart diagram of the audio signal pathway.

FIG. 4 illustrates the preferred embodiment of the audio signal as it is manipulated by the special effects device. The musical instrument generates an instrument signal. That instrument signal is then transmitted to the special effects unit input. The audio signal is then biased to an acceptable voltage for the Digital Signal Processor at the Input signal conditioning amplifier. The biased audio signal is then converted from an analog signal to a digital signal and then processed by a Digital Signal Processor onboard the internal microcontroller. Once the Digital Signal Processor applies the desired special effect to the digital audio signal, the digital audio signal is then converted back to an analog signal. The analog audio signal is then returned to the original voltage at the Output signal conditioning amplifier. The manipulated analog audio signal is sent to a sound making device or amplifier by the Effects unit output.

Figure 5:
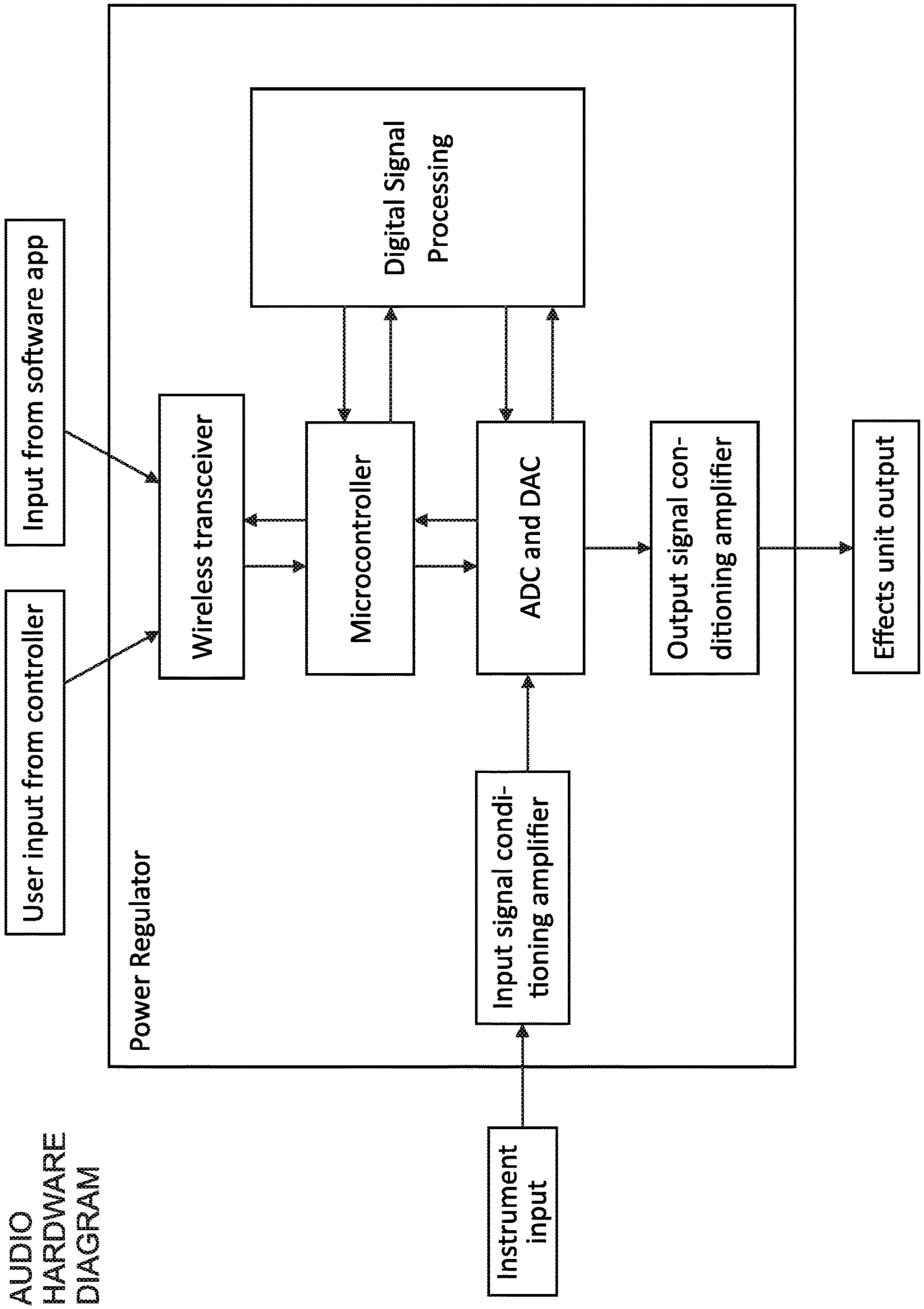
FIG. 5 is a flow chart diagram of the audio hardware of the present invention.

Adverting to FIG. 5, the special effects unit contains an input signal conditioning amplifier, an output signal conditioning amplifier, an analog to digital converter, a digital to analog converter, a microcontroller, and at least one wireless transceiver. The microcontroller contains memory and digital signal processing means. In a preferred embodiment the memory and digital signal processor are contained onboard the microcontroller or are separate hardware components within the special effects unit.

To begin the audio manipulation of the audio signal, the wireless transceiver first receives instructions from the software application and the wireless controller. The application will program certain desired special effects on to the special effects unit, to be stored in the microcontroller's memory, and the wireless controller will instruct the unit, more specifically the microcontroller, to turn on or off whichever effects the user selects. Then, the special effects unit receives analog signals from the instrument input when the user plays a chord or musical note. The signal is conditionally amplified to a specific range so that it can be converted from analog to digital by the analog to digital converter. That amplified digital signal is then processed by the digital signal processor contained within the microcontroller where the desired effect(s) is applied to the signal. The modified signal then leaves the microcontroller where the modified digital signal is converted back to analog by the digital to analog converter. Finally, the modified analog signal is then conditionally amplified to an appropriate range for the output. The output signal is the modified analog signal that has been amplified to the appropriate range for whatever output device is being used, such as an amplifier or headphones.

The memory of the special effects unit is configured in a software application. The software application communicates instructions via Bluetooth® communication or any other suitable wireless communications protocol. These instructions are saved in the software application and in the effects unit. The software application settings and digital signal processor module are constantly synced. The memory state of the software application will be compared against the digital signal processing device. The memory state of a web server will be compared against the digital signal processing device. This configuration allows a user to easily retrieve and continue using the settings he or she selected in a previous session.

Figure 6:
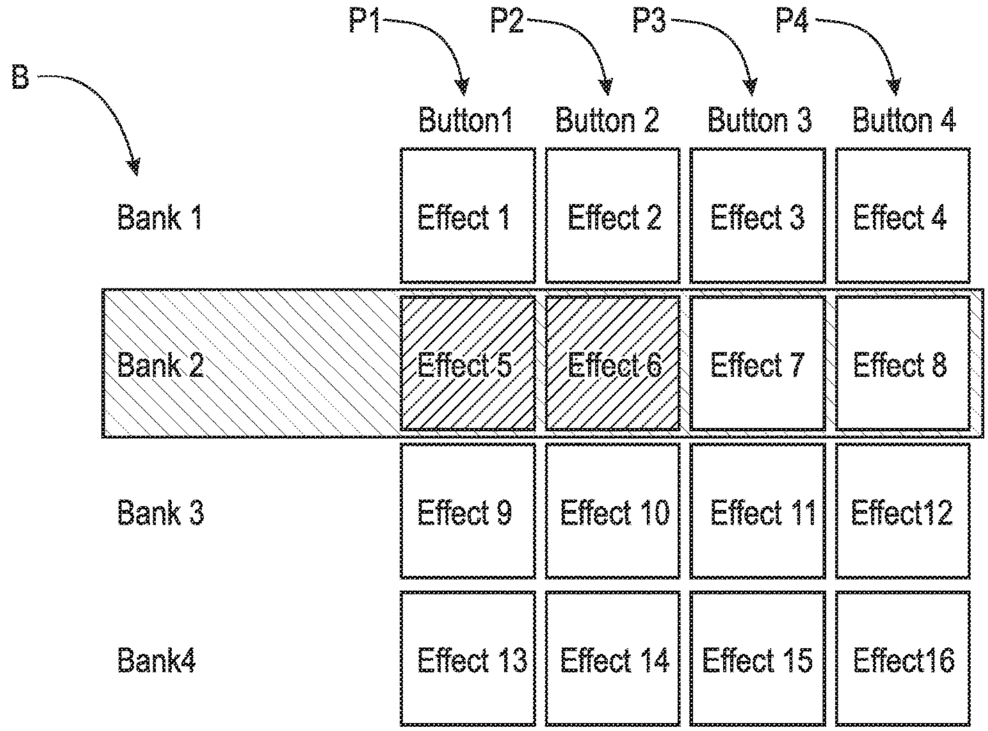
FIG. 6 is a schematic drawing of the audio effects bank of the special effects device.

Adverting to FIG. 6, the four-button wireless controller has one effect per button. Each button turns one effect on or off. "Banking" buttons, or knobs, are used to switch between banks of four effects. Essentially, the buttons relate to whatever effect, or algorithm, is programmed to its respective slot (button 1=effect 1 for bank 1, effect 5 for bank 2, etc.). The signal chain is read from left to right, with an instrument on the left and the output on the right. When a user shifts from one bank to another, a user sets defaults as to which of the four effects will be turned on. In FIG. 6, for example, the first two effects are turned on, and the signal chain is: Input>Effect 5>Effect 6>Output.

Figure 7:
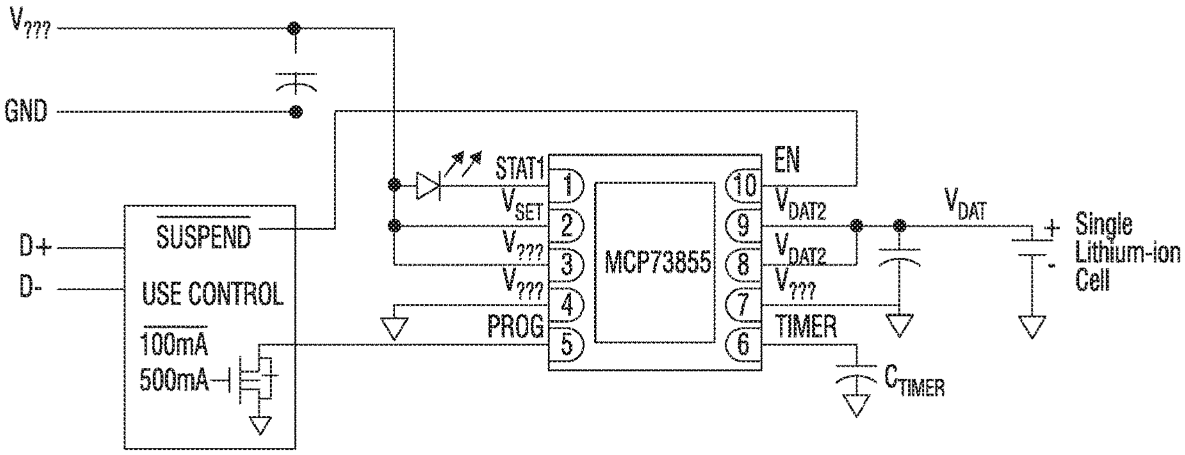
FIG. 7 is a schematic drawing of an application circuit that facilitates battery charging via a USB port for the wireless controller.

Adverting to FIG. 7, this battery charging circuit uses the MCP73853/MCP73855 linear charge management controllers for cost sensitive applications. They are specially designed for USB applications and adhere to all the USB specifications governing the USB power bus. The circuit shown in FIG. 7 uses the MCP73855 to design a USB-powered Lithium Ion/Lithium Polymer battery charger by deriving the power from the USB port.

The power source must have voltage of 5V exactly (4.75-5.25 probably will be fine as well). Less voltage will not work, and more voltage will damage the device. The more current the power source can give the better. No need to be afraid of "too much current." The battery charge controller will draw what it needs. Data pins (pins 2, 3) should be short-circuit. It can be done on the power source or on the cable itself, as long as the battery charge controller will get the same voltage from these two pins. The USB cable wires should not be too thin or too long, and should be of good quality, which will allow high current to pass through them.

Figure 8:
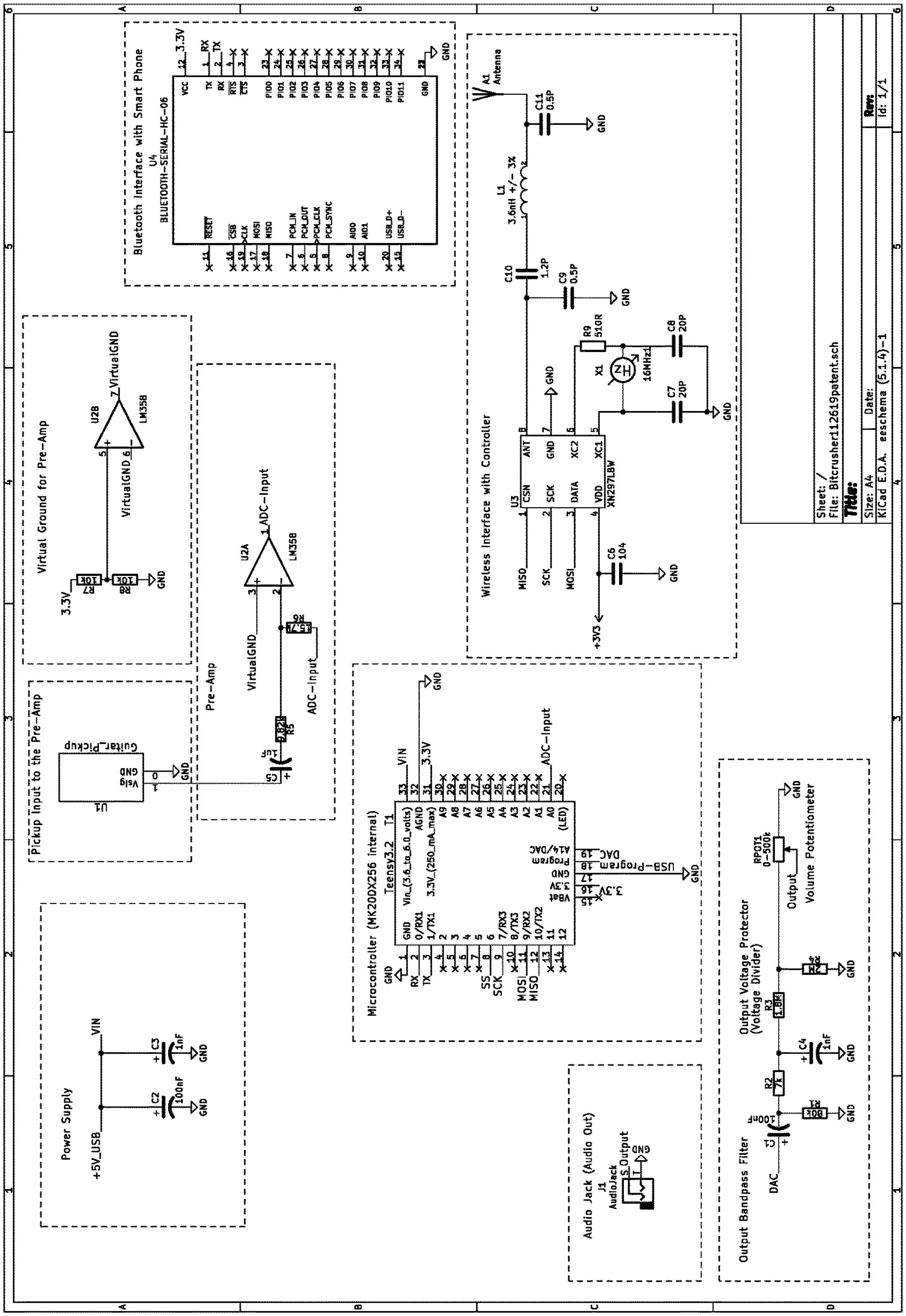
FIG. 8 is a schematic drawing of the Power Supply circuit, the Pickup Input to the Pre-Amp circuit, the Pre-Amp circuit, Virtual Ground for Pre-Amp circuit, the Microcontroller circuit, the Wireless Interface with Controller circuit, the Bluetooth Interface with Smart Phone circuit, the Output Bandpass Filter circuit, and the Audio Jack circuit of the present invention.

Adverting to FIG. 8, shows the entire schematic design for special effects unit 10. Power Supply circuit receives power from USB 33 on special effects unit 10. The Power Supply circuit receives a standard 5V USB power connector. FIG. 8 shows Pickup Input to the Pre-Amp. The Pickup Input to the Pre-Amp receives an analog signal from a musical instrument. The Pickup Input to the Pre-Amp further comprises Op-Amp U2A and Op-Amp U2B. Op-Amp U2A comprises coupling capacitor C5, resistors R5, R6, Virtual Ground VirtualGND, and pre-amp audio signal output ADC-Input. Op-Amp U2B comprises voltage divider R7, R8, and Op-Amp U2B. Op-Amp U2B provides a virtual ground for Op-Amp U2A in order to bias the audio signal to a preferred voltage range of above 0 to 3.3V.

In continuing reference to FIG. 8, microcontroller T1 is operatively arranged to receive pre-amp audio signal output ADC-Input. Microcontroller T1 is configured to receive information from wireless controller 20 to activate special effects based on the selected user input. Wireless Interface U3 is configured to receive selected user input from wireless controller 20 and communicate said user input to Microcontroller T1. Wireless Interface U3 is configured to communicate over a 2.4 GHz radio frequency. Microcontroller T1 further comprises Bluetooth interface U4. Bluetooth interface U4 is configured to receive special effects programming information from special effects software application. Data from Bluetooth interface U4 is sent to Microcontroller T1 to arrange, modify, delete, or add special effects to Microcontroller T1 internal library of special effects. The Output Bandpass Filter receives output audio signal DAC from Microcontroller T1. The Output Bandpass Filter removes undesired frequencies from the manipulated audio signal. The Output Bandpass Filter sends filtered manipulated audio signal to Audio Jack J1. Audio Jack J1 is operatively arranged to send audio signal to a sound making device or amplifier.

Figure 9:
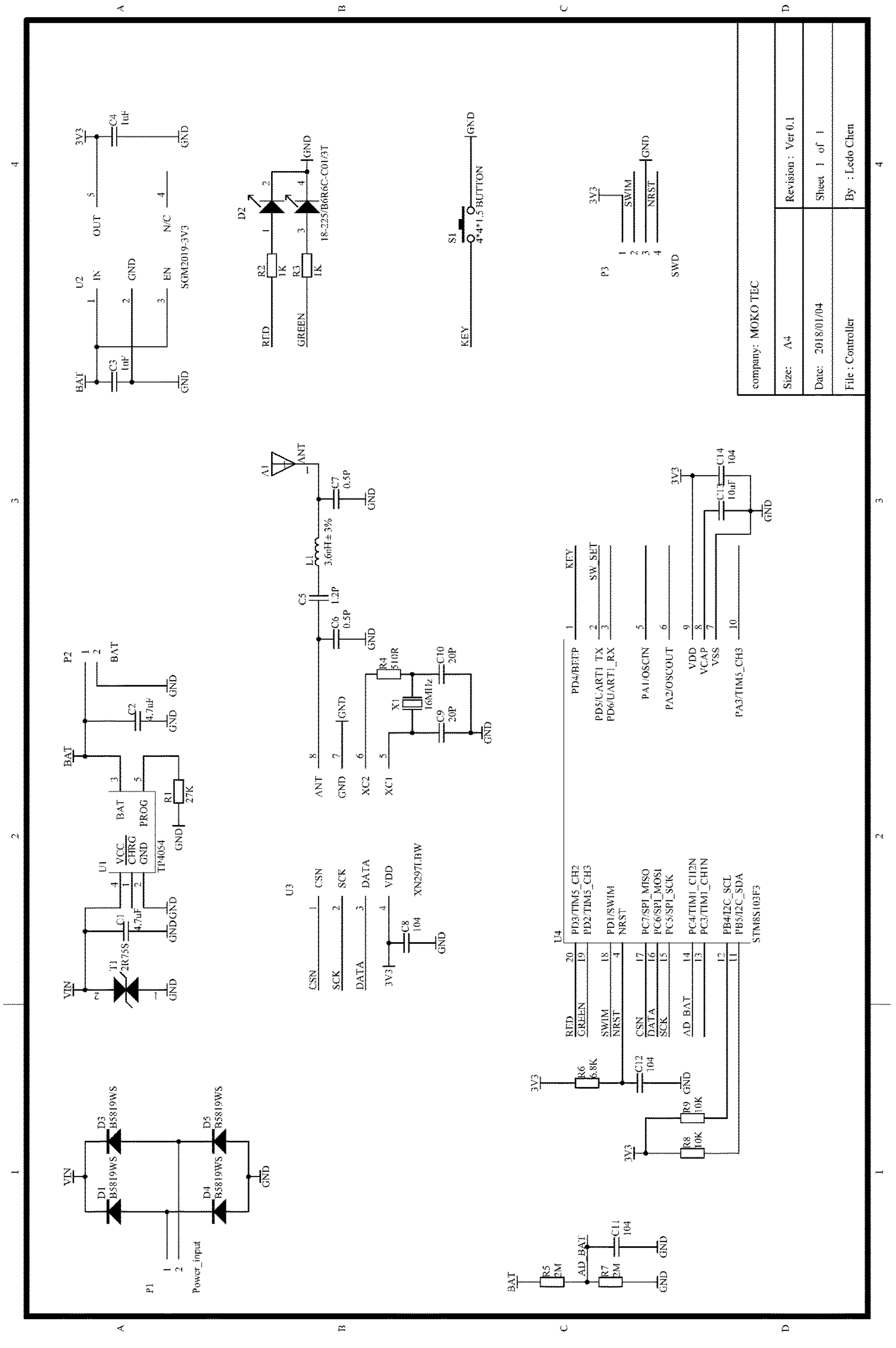
FIG. 9 is a schematic drawing of the Wireless Controller circuit including the Battery Charging Regulator circuit, the Power Regulator Circuit, the Wireless Transmitter circuit, the Indicator LED circuit, the Microcontroller circuit, the User Button circuit, the Programming Interface circuit, and the Voltage Diver circuit of the present invention.

FIG. 9 shows the entire schematic design for wireless controller 20. In this embodiment, wireless controller 20 is operatively arranged with one user selection button, however, in other preferred embodiments wireless controller 20 may be operatively arranged with a plurality of buttons and knobs or other user selection sensors or switches. Power input P1 is operatively arranged to provide a power supply from the charging cable to the battery charging circuit. Battery charging circuit U1 accepts power and delivers it safely to the battery. Power regulator circuit U2 receives power from the battery and converts it into a stable 3.3V supply for wireless controller 20. Voltage divider AD BAT divides the power from the battery in half for microcontroller U4. Microcontroller U4 receives user input from user selection button S1 and communicates the user input to wireless transmitter U3 which transmits said user input information to special effects unit 10 over 2.4 GHz radio frequency. Microcontroller U4 also receives user input from user selection button S1 which toggles LED indicator D2. Programming Interface P3 is used to program microcontroller U4 which allows wireless controller 20 to function as described.

Figure 10:
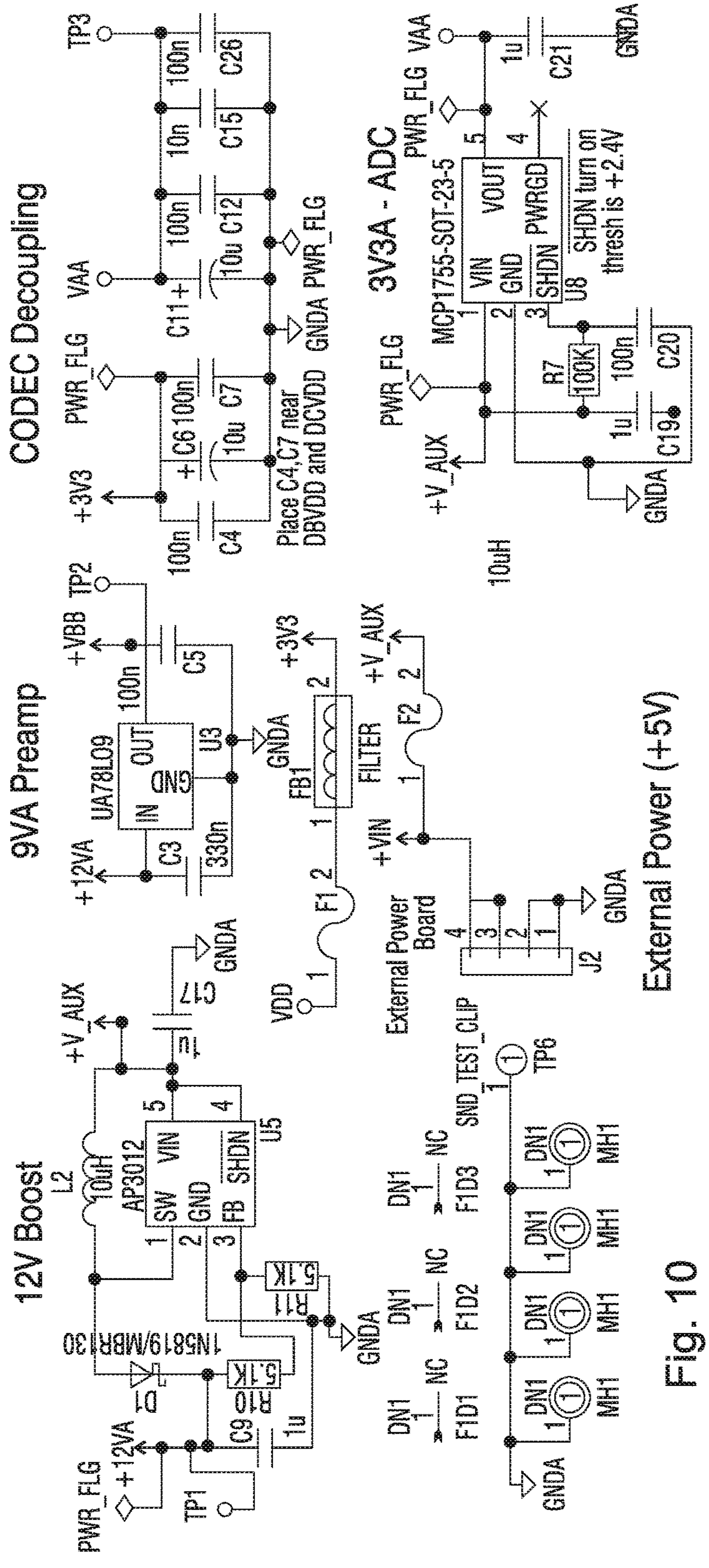
FIG. 10 is a schematic drawing of a Preamp Gain Switch circuit.

Adverting to FIG. 10, the preamp gain switch selects the gain of the high-impedance preamp. Preamp gain is either 0 dB (unity) or +12 dB gain.

Figure 11:
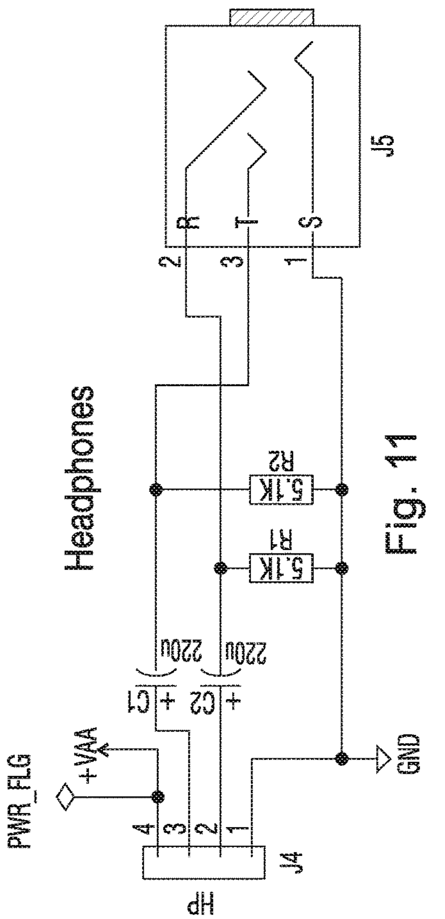
FIG. 11 is a schematic drawing of a Headphones circuit.

In an alternative embodiment, special effects unit 10 would comprise an additional headphone jack which would allow a user to listen to the output audio signal via any auxiliary audio compliant device. FIG. 11 shows the auxiliary audio output circuit.

The user interface of the special effects unit exists in a software application and a wireless remote control. The three-part system—the special effects unit, the wireless controller, and the software application—can be used with various instruments or devices, including, but not limited to, a bass, an electric keyboard, an electric violin microphone, a piezoelectric transducer, and/or an electromagnetic transducer. More generally, this three-part system can be used by any device that generates audio or uses signal processing.

Figure 13:
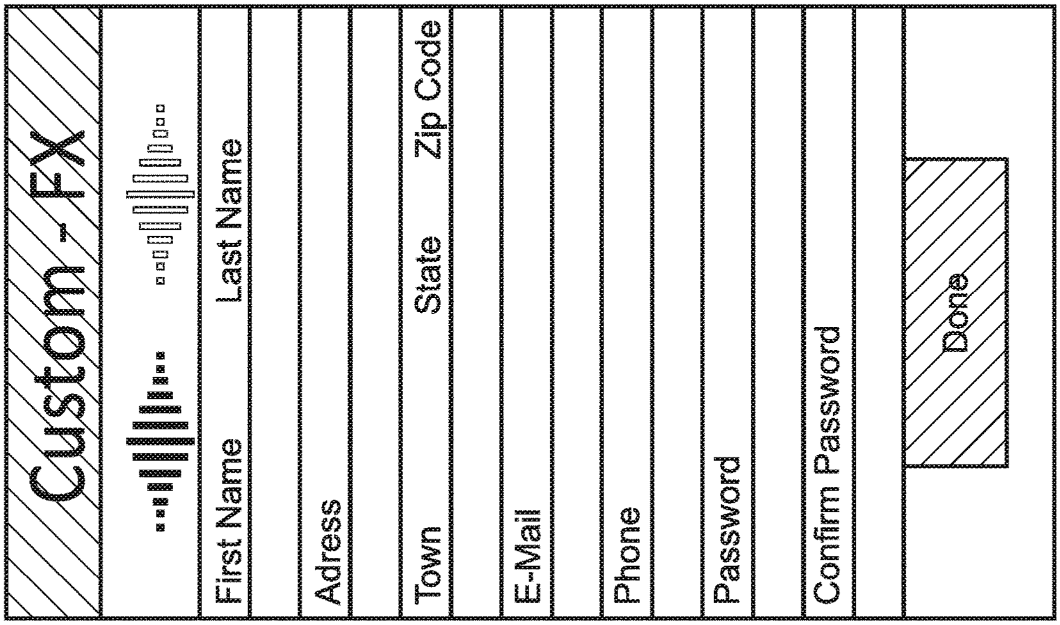
FIG. 13 is a second screenshot of the software application.
Figure 12:
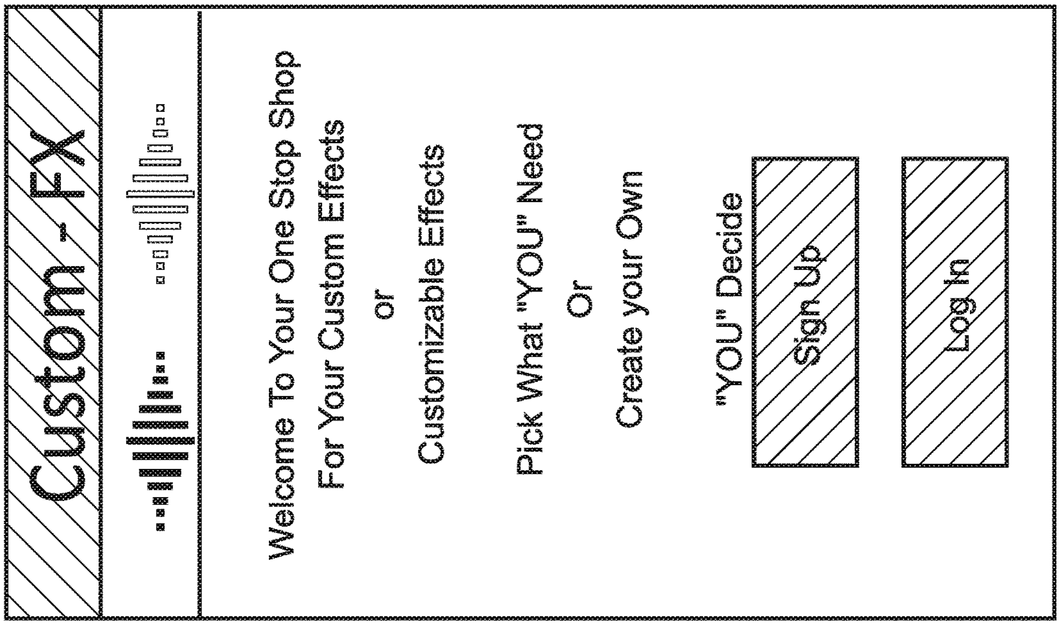
FIG. 12 is a first screenshot of a software application.
Figure 14:
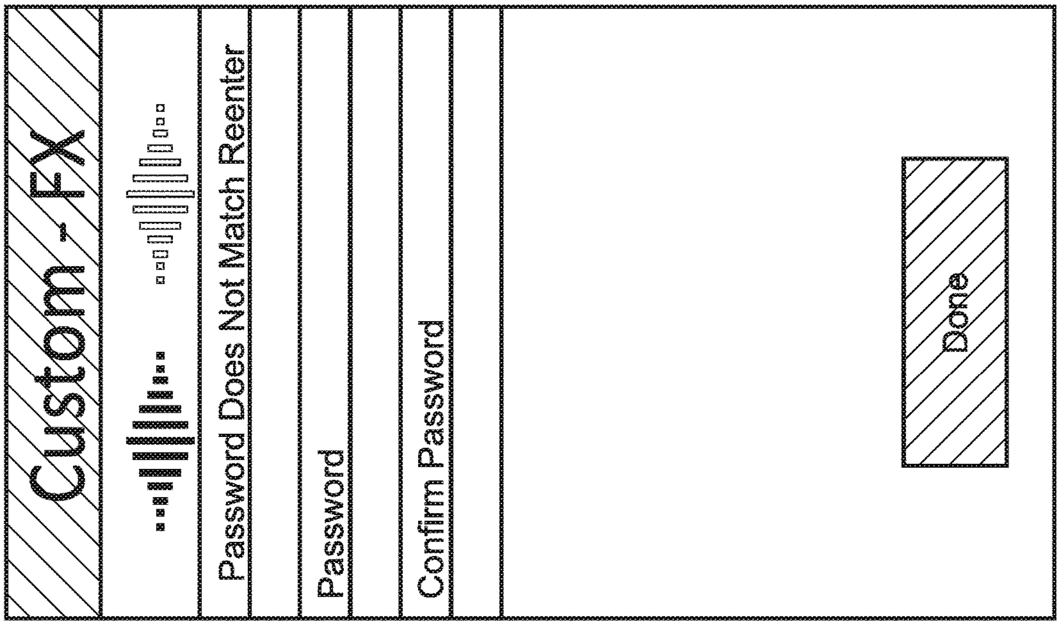
FIG. 14 is a third screenshot of the software application.

A preferred embodiment of the software application interface is shown in various Figures. FIG. 12 shows the first screen a user will see where two options are available, one to "Sign up"/create an account and one to "Login" to an existing account. FIG. 13 shows the next screen if the user selected the "Sign up" option where the user will have to enter some information. FIG. 14 shows the next screen if the user selected the Login option where the user will have to enter a password.

Figure 15:
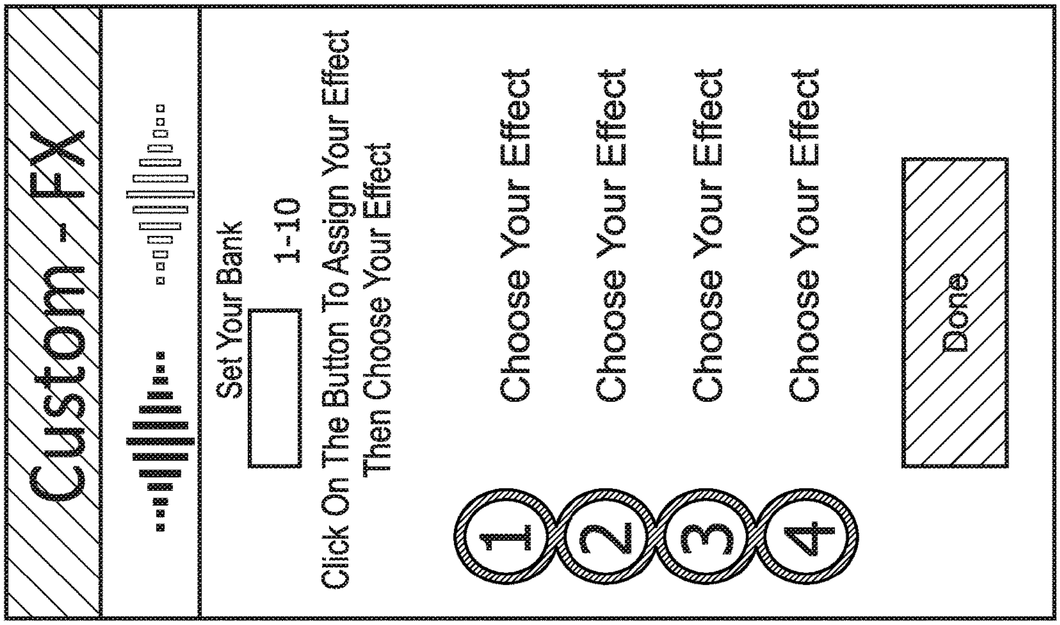
FIG. 15 is a fourth screenshot of the software application.
Figure 17:
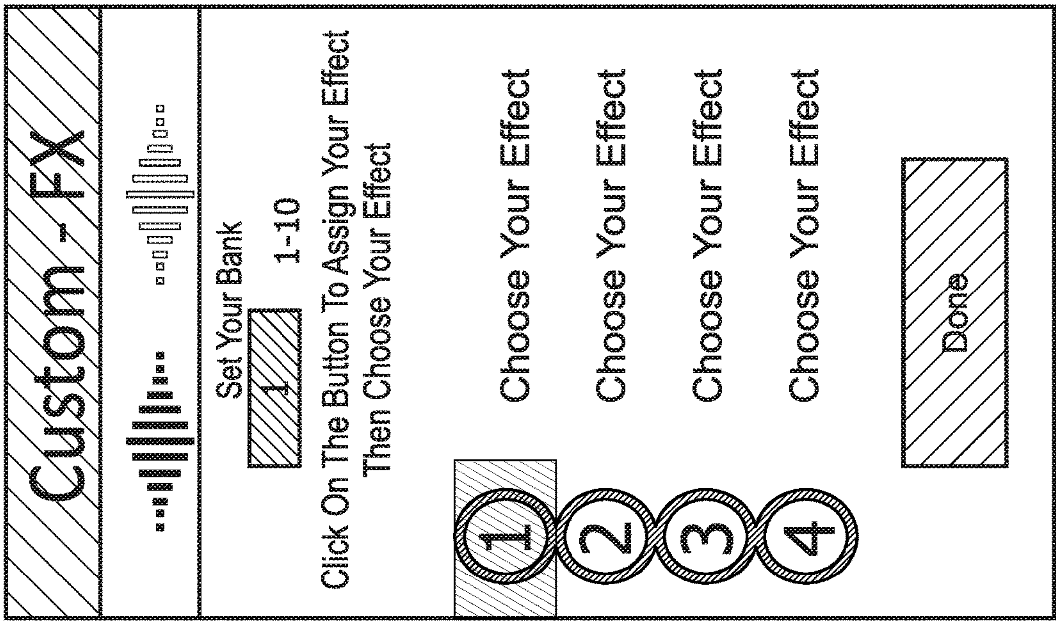
FIG. 17 is a sixth screenshot of the software application.
Figure 16:
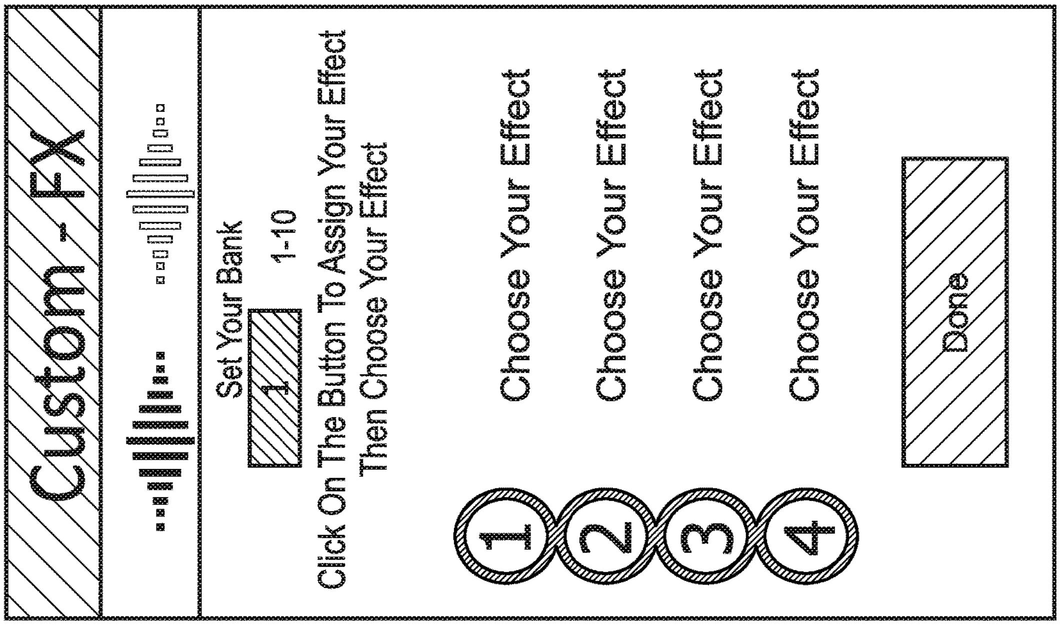
FIG. 16 is a fifth screenshot of the software application.
Figure 18:
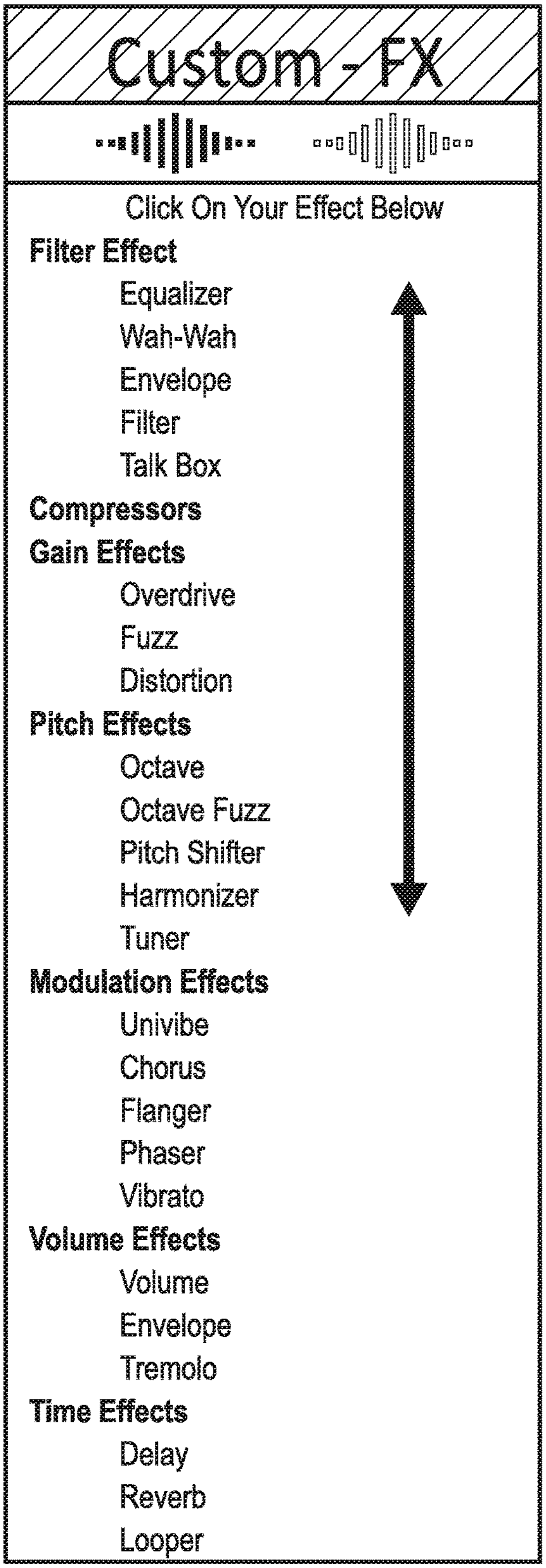
FIG. 18 is a seventh screenshot of the software application.
Figure 19:
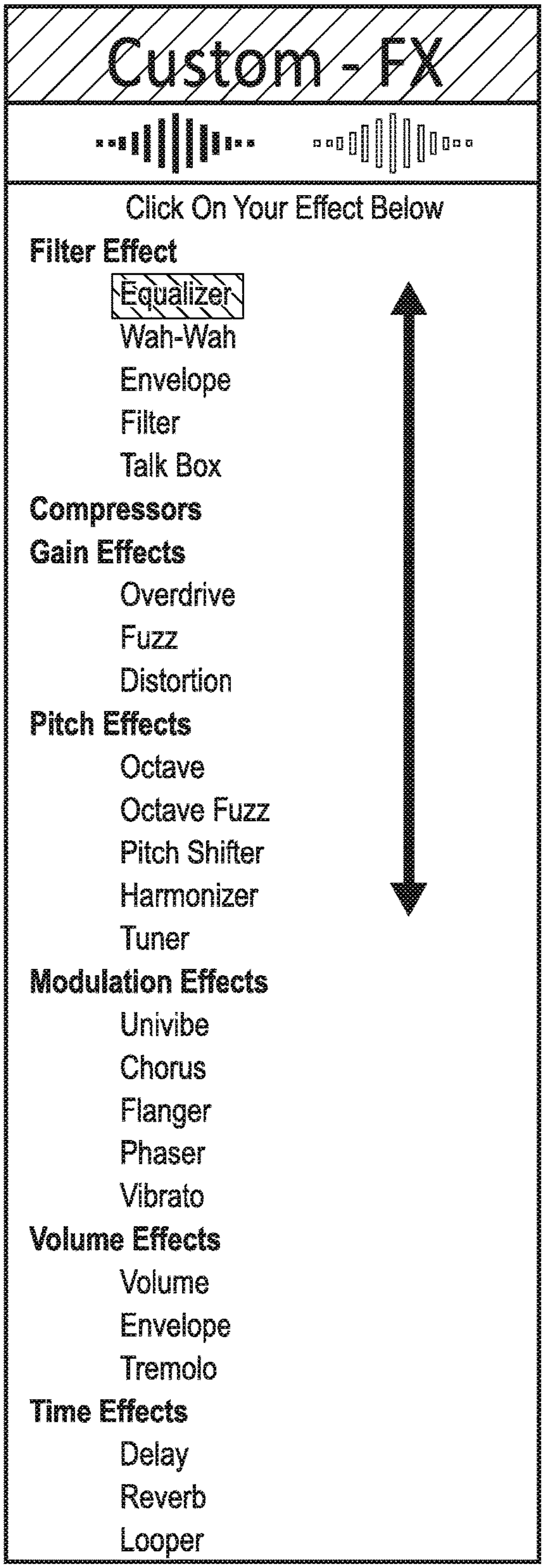
FIG. 19 is an eighth screenshot of the software application.
Figure 21:
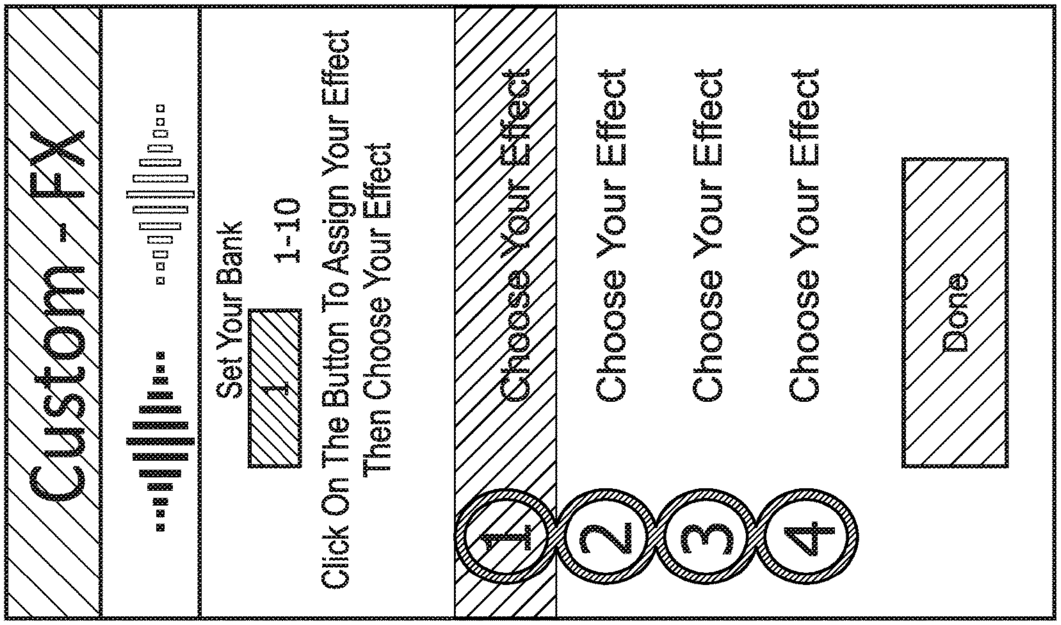
FIG. 21 is a tenth screenshot of the software application.
Figure 20:
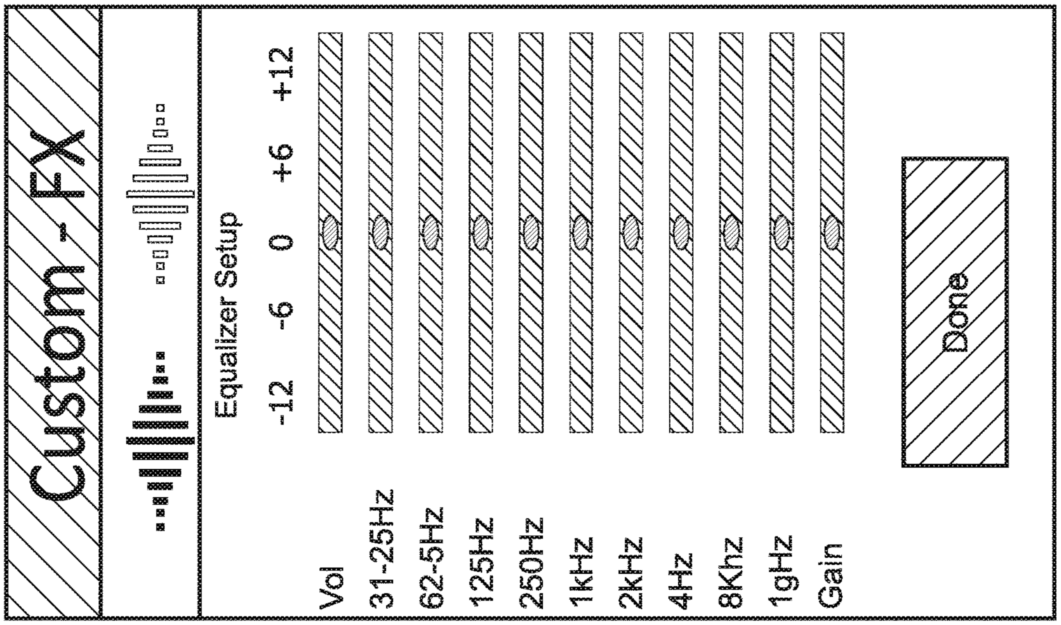
FIG. 20 is a ninth screenshot of the software application.

FIG. 15 shows the interface after the user has successfully logged in. The user will be able to program a plurality of different groupings or "banks" of effects where the user simply indicates what bank (1-10 as shown in this embodiment) they are setting and then chooses which effect slot (1-4 as shown in this embodiment) they want to set. FIG. 16 shows that the user wants to set bank 1. FIG. 17 shows that the user wants to set effect 1 of bank 1. FIG. 18 shows an example of the scrollable list of effects that would be available to set in the selected slot (effect 1 of bank 1 in based on previous Figures). FIG. 19 shows that the effect selected to be set in the identified effect slot is "Equalizer." FIG. 20 shows the next screen after a user selects a desired effect where they will be able to adjust the parameters of the effect. FIG. 21 shows the screen the user will see after the effect has been set to the desired slot; the extra shading shows the user that that slot is already set.

Figure 22:
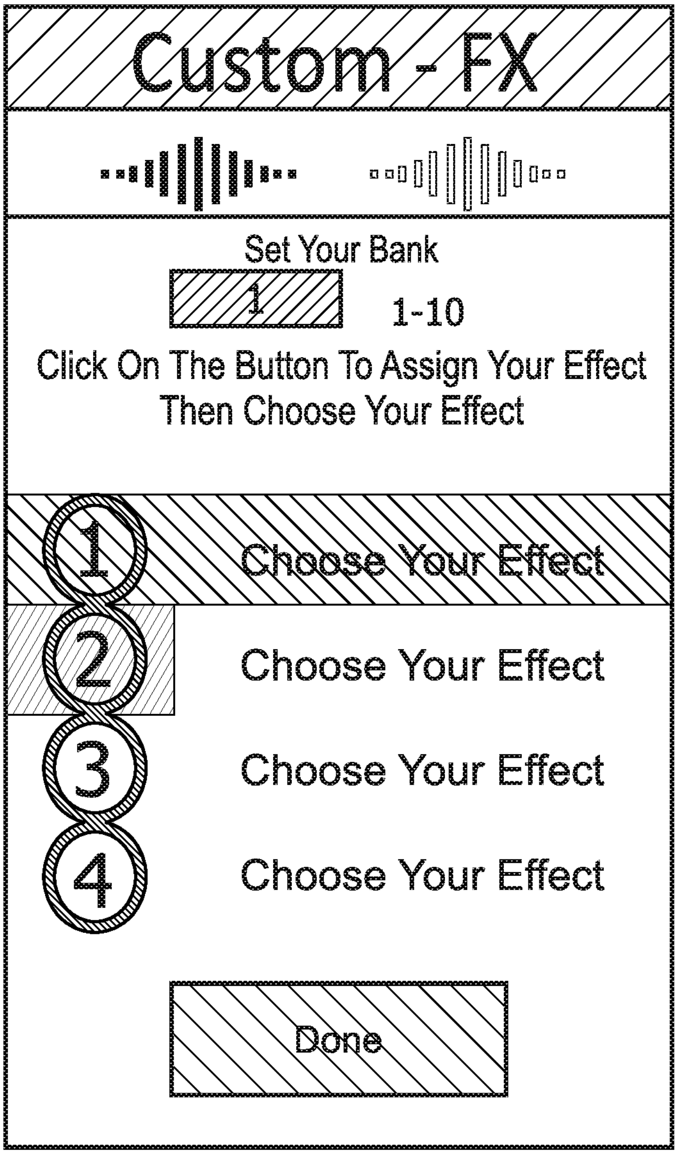
FIG. 22 is an eleventh screenshot of the software application.
Figure 23:
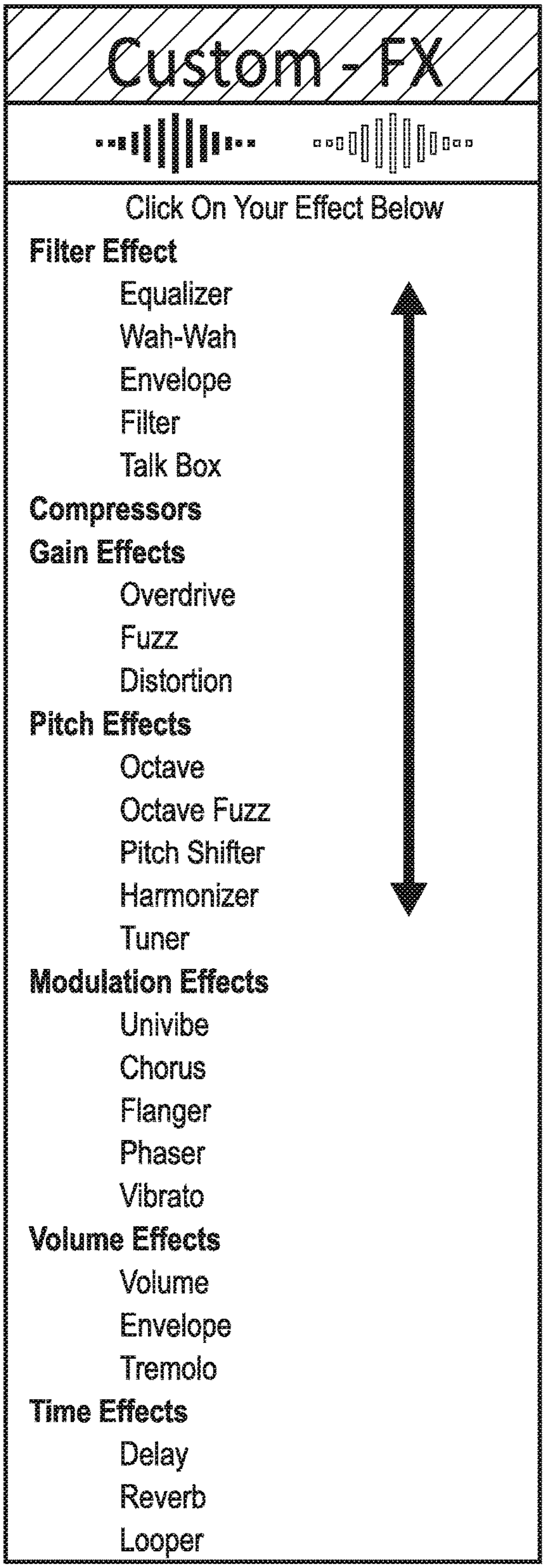
FIG. 23 is a twelfth screenshot of the software application.
Figure 24:
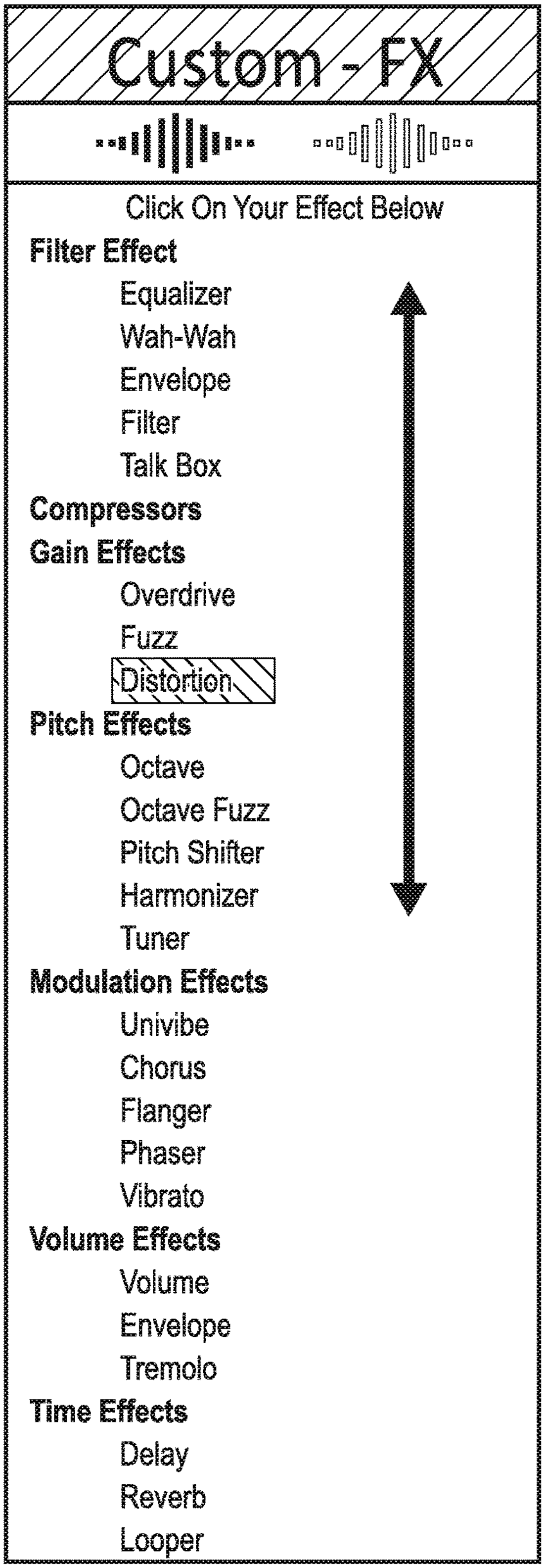
FIG. 24 is a thirteenth screenshot of the software application.
Figure 25:
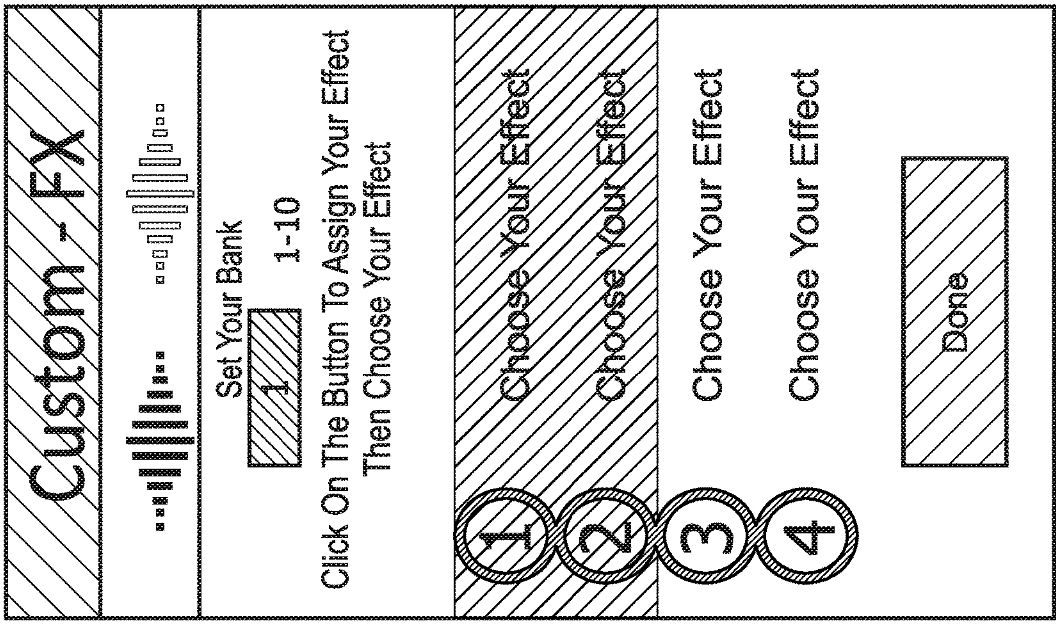
FIG. 25 is a fourteenth screenshot of the software application.
Figure 26:
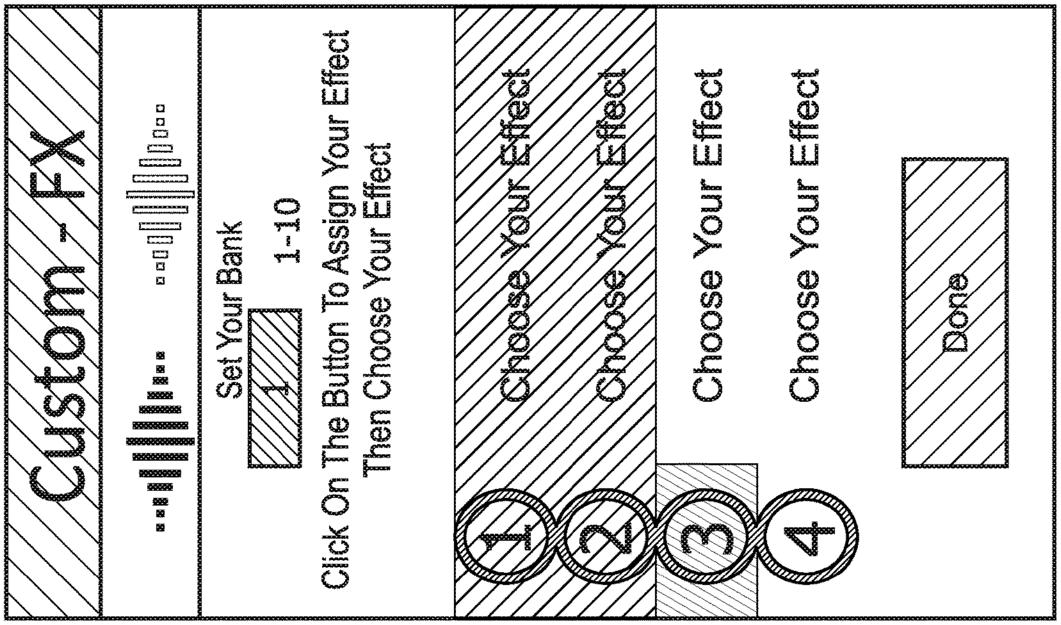
FIG. 26 is a fifteenth screenshot of the software application.
Figure 27:
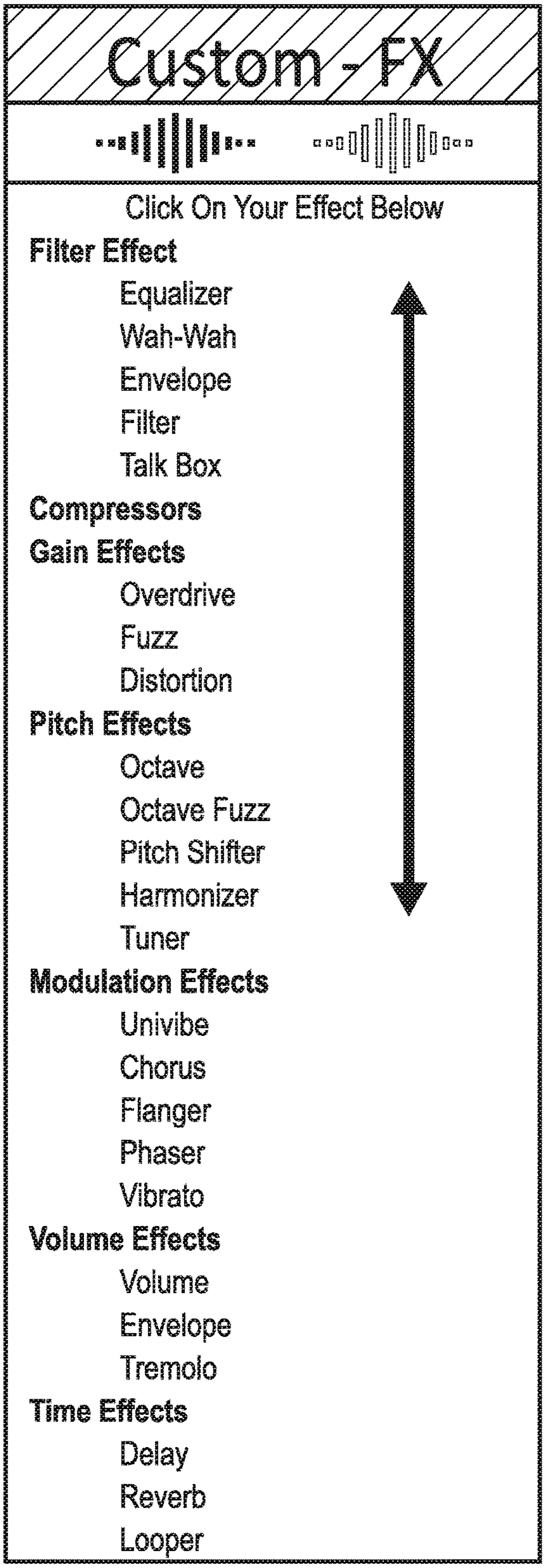
FIG. 27 is a sixteenth screenshot of the software application.
Figure 28:
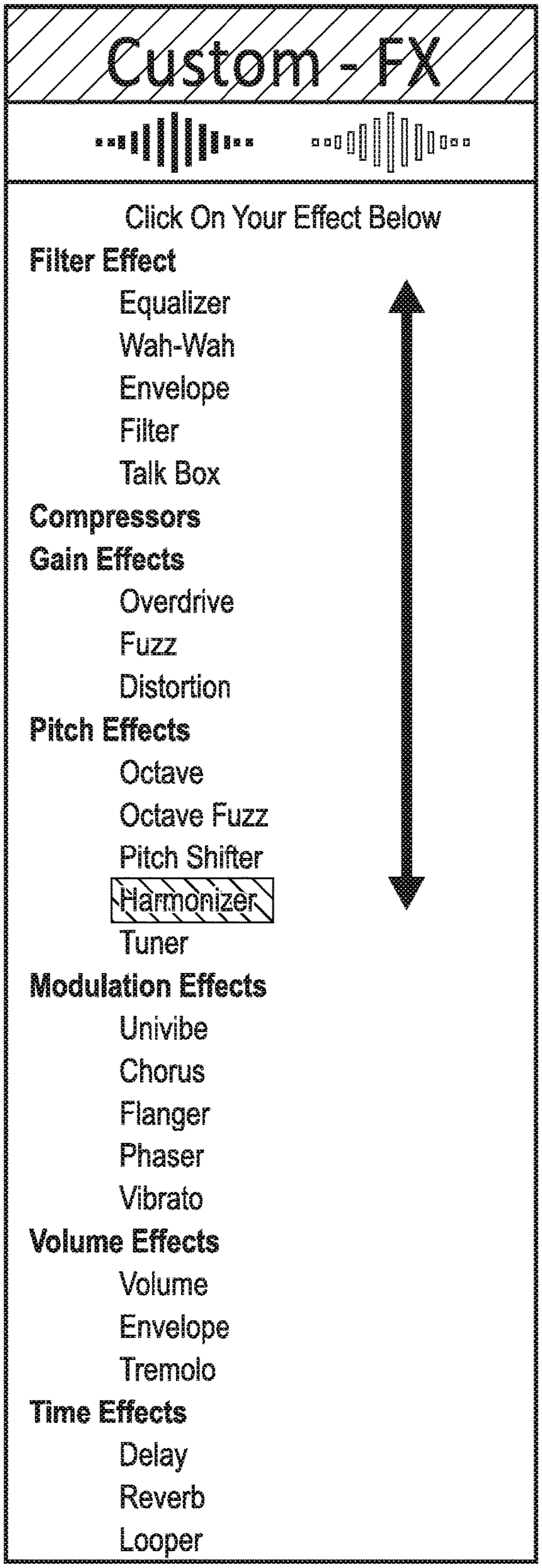
FIG. 28 is a seventeenth screenshot of the software application.
Figure 29:
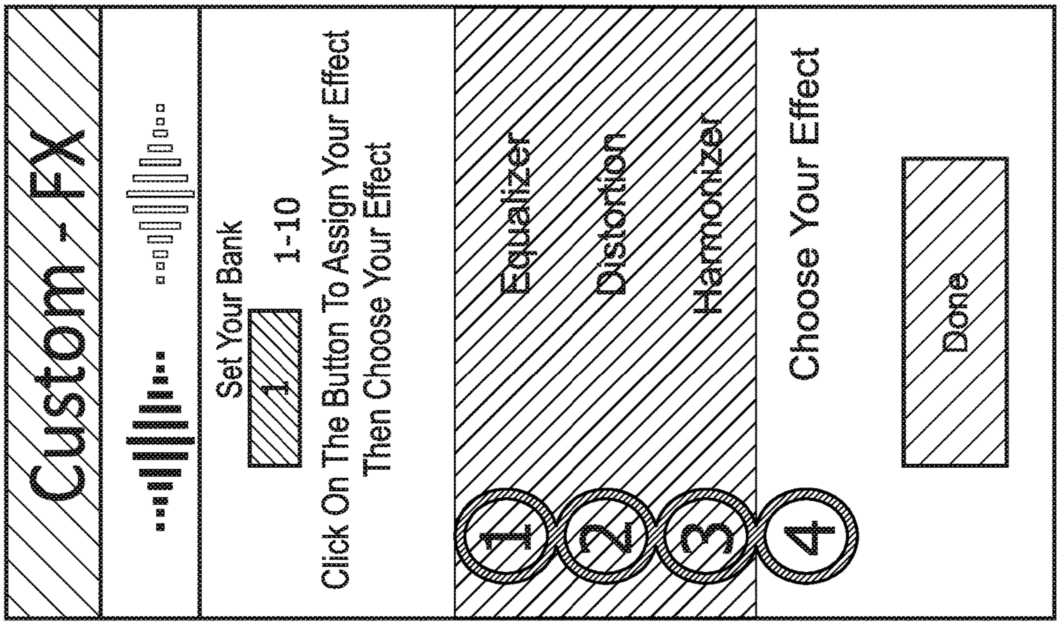
FIG. 29 is an eighteenth screenshot of the software application.

FIG. 22 shows effect 1 of bank 1 already set and effect 2 of bank 1 selected to be set. FIG. 23 shows an example of the scrollable list of effects that would be available to set in the selected slot. FIG. 24 shows the effect "Distortion" as the selected effect to be set. FIG. 25 shows effects 1 and 2 have been set. FIG. 26 shows that effects 1 and 2 of bank 1 have been set and effect 3 of bank 1 has been selected to be set. FIG. 27 shows an example of the scrollable list of effects that would be available to set in the selected slot. FIG. 28 shows the effect "Harmonizer" as the selected effect to be set. FIG. 29 shows a preferred embodiment of the interface where the effects that have been set not only have extra shading but also have text indicating the effect that has been set in each respective effect slot (Equalizer=effect 1; Distortion=effect 2; Harmonizer=effect 3).

Figure 30:
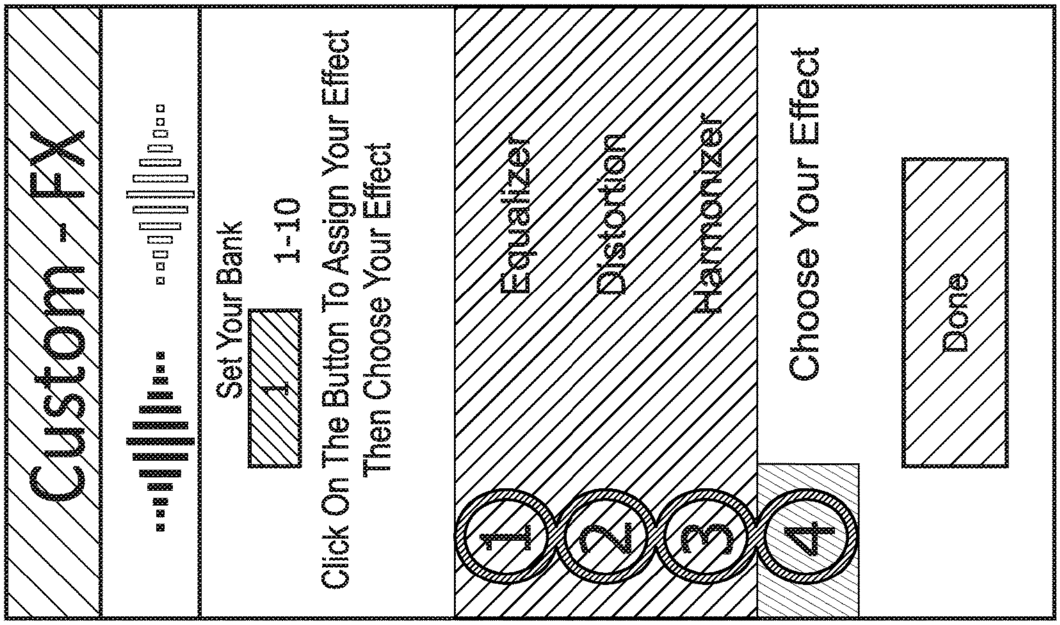
FIG. 30 is a nineteenth screenshot of the software application.
Figure 31:
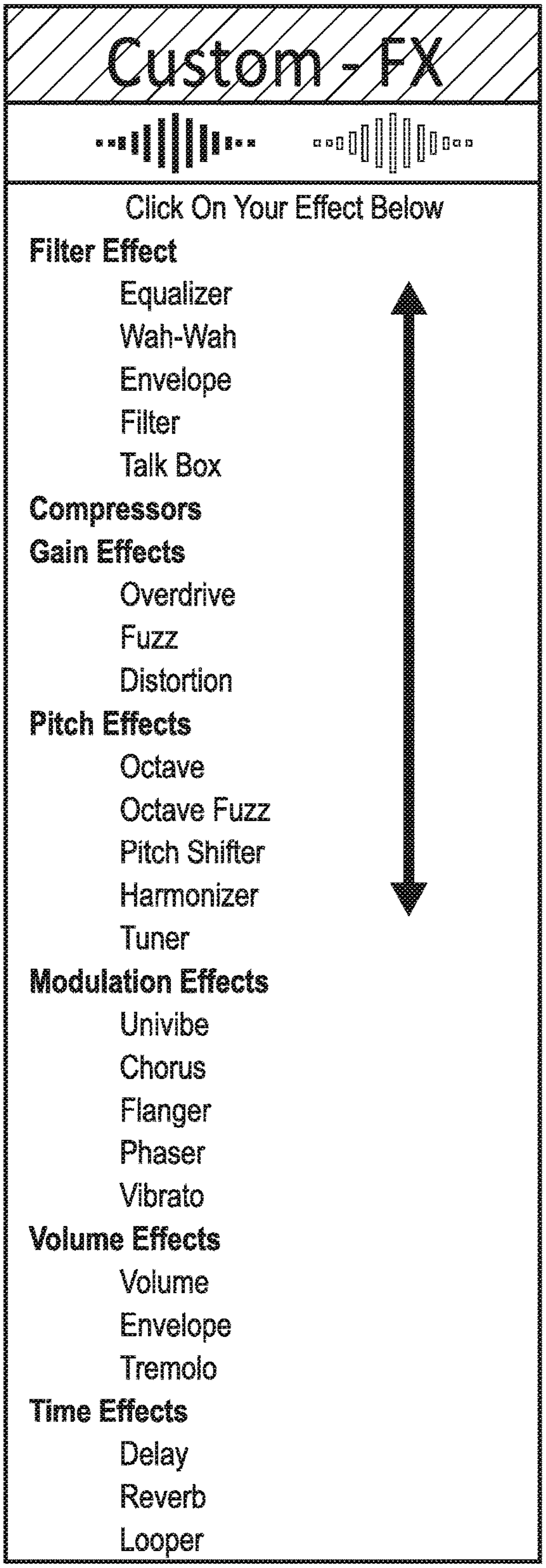
FIG. 31 is a twentieth screenshot of the software application.
Figure 32:
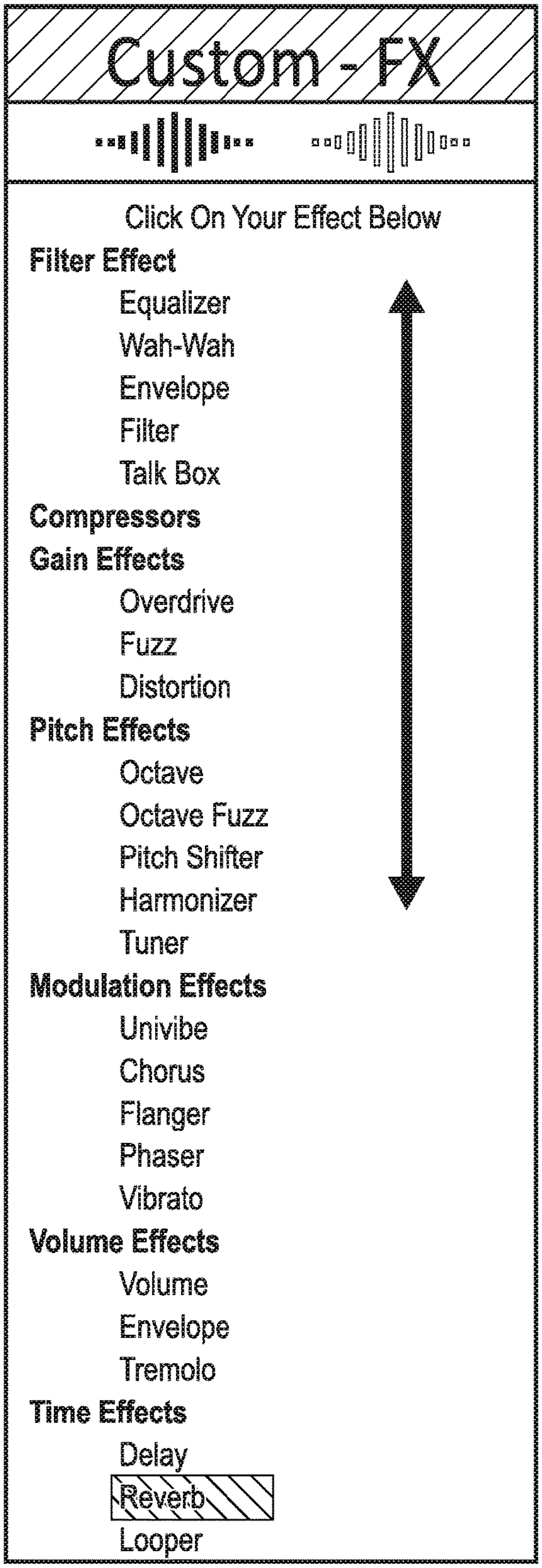
FIG. 32 is a twenty-first screenshot of the software application.
Figure 33:
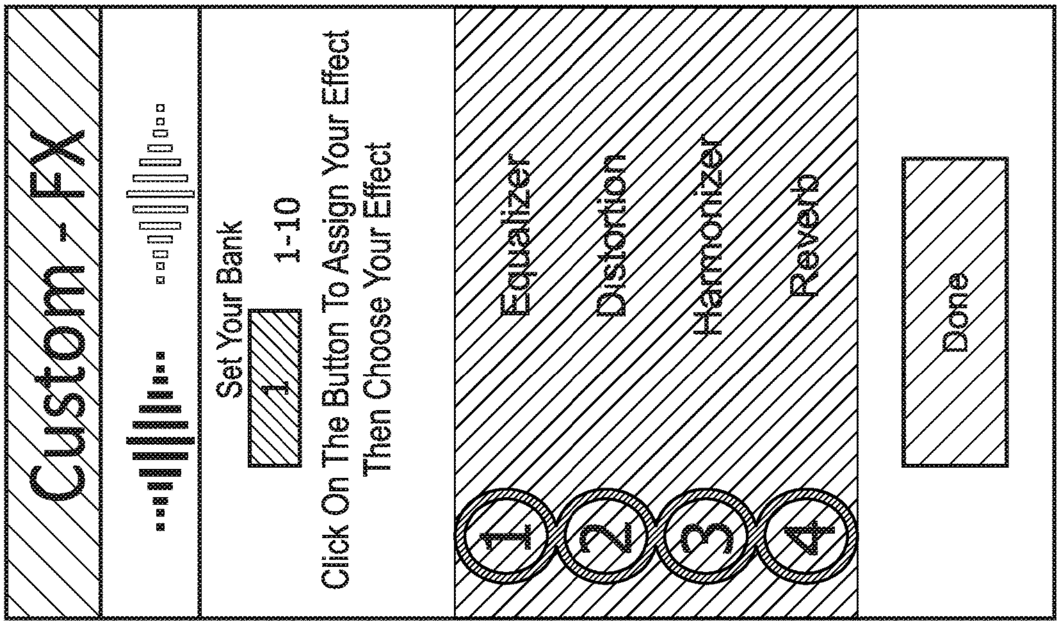
FIG. 33 is a twenty-second screenshot of the software application.

FIG. 30 shows that effects 1, 2 and 3 of bank 1 have been set and that effect 4 of bank 1 is selected to be set. FIG. 31 shows an example of the scrollable list of effects that would be available to set in the selected slot. FIG. 32 shows the effect "Reverb" as the selected effect to be set in the selected slot. FIG. 33 shows the effects that have been set not only have extra shading but also have text indicating the effect that has been set in each respective effect slot (Equalizer=effect 1; Distortion=effect 2; Harmonizer=effect 3; Reverb=effect 4).

Figure 34:
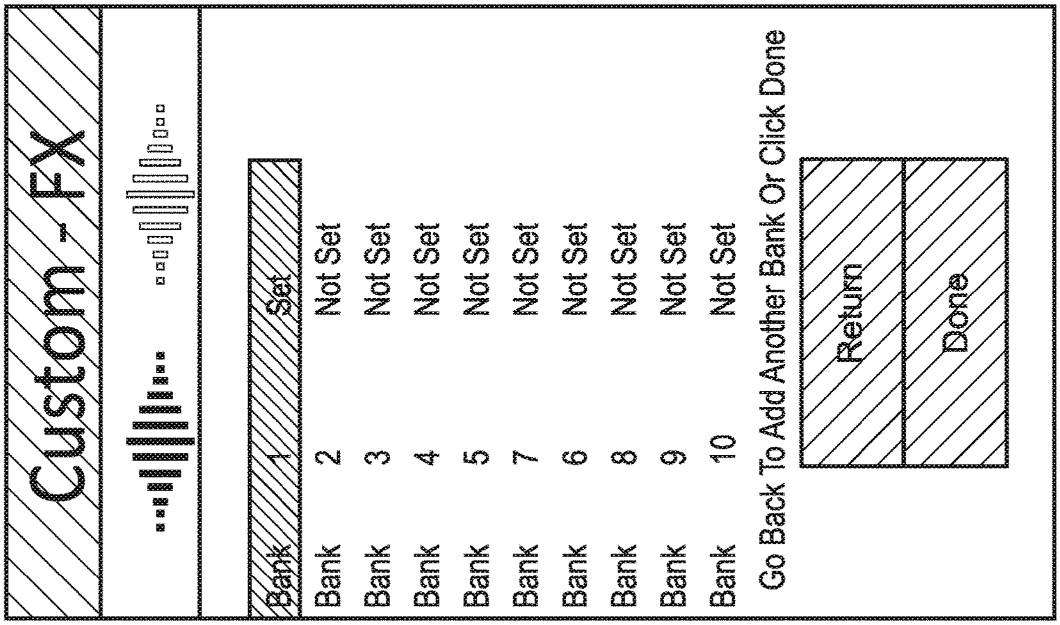
FIG. 34 is a twenty-third screenshot of the software application.
Figure 35:
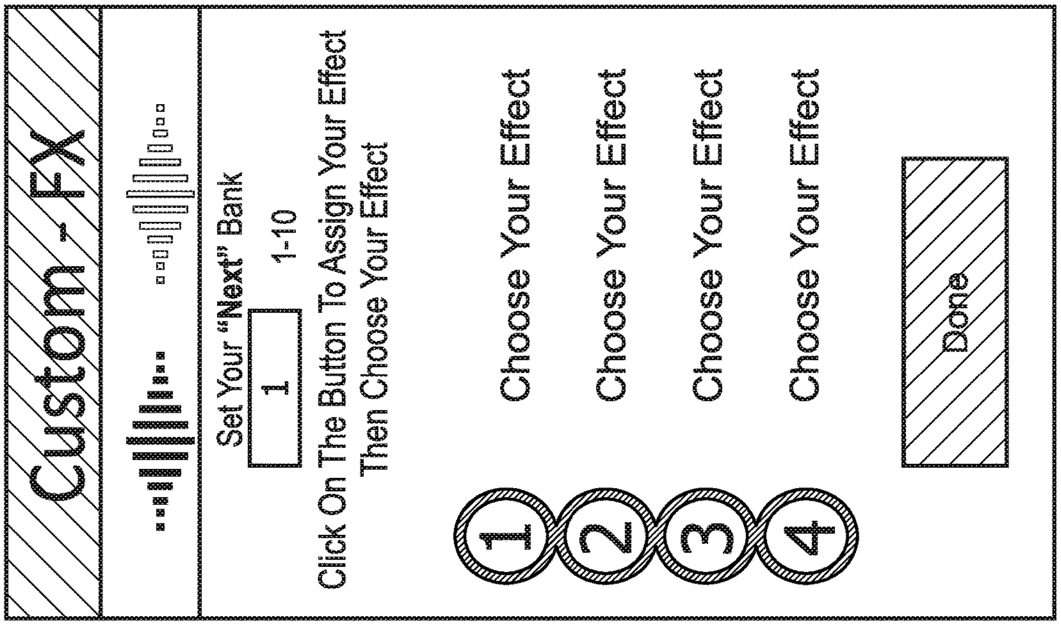
FIG. 35 is a twenty-fourth screenshot of the software application.

FIG. 34 shows the next screen the user will see when they done setting a bank of effects. FIG. 34 indicates that bank 1 is set, and the remaining banks (2-10) have not been set. The user may select "Return" to return to a screen similar to FIGS. 16, 21, 25, 29, and 33 where the user may select another bank to set, or the user may select "Done" if this is the only bank desired to be programmed on the special effects unit. FIG. 35 shows that the user selected "Return" on the previous screen and must choose which bank of effects they want to set.

Figure 36:
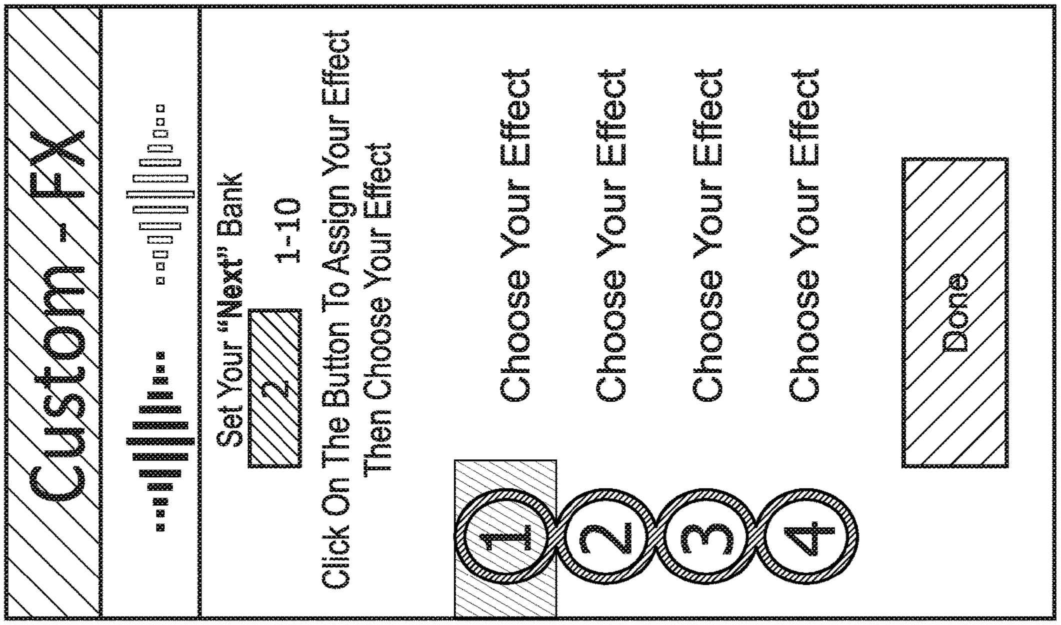
FIG. 36 is a twenty-fifth screenshot of the software application.
Figure 37:
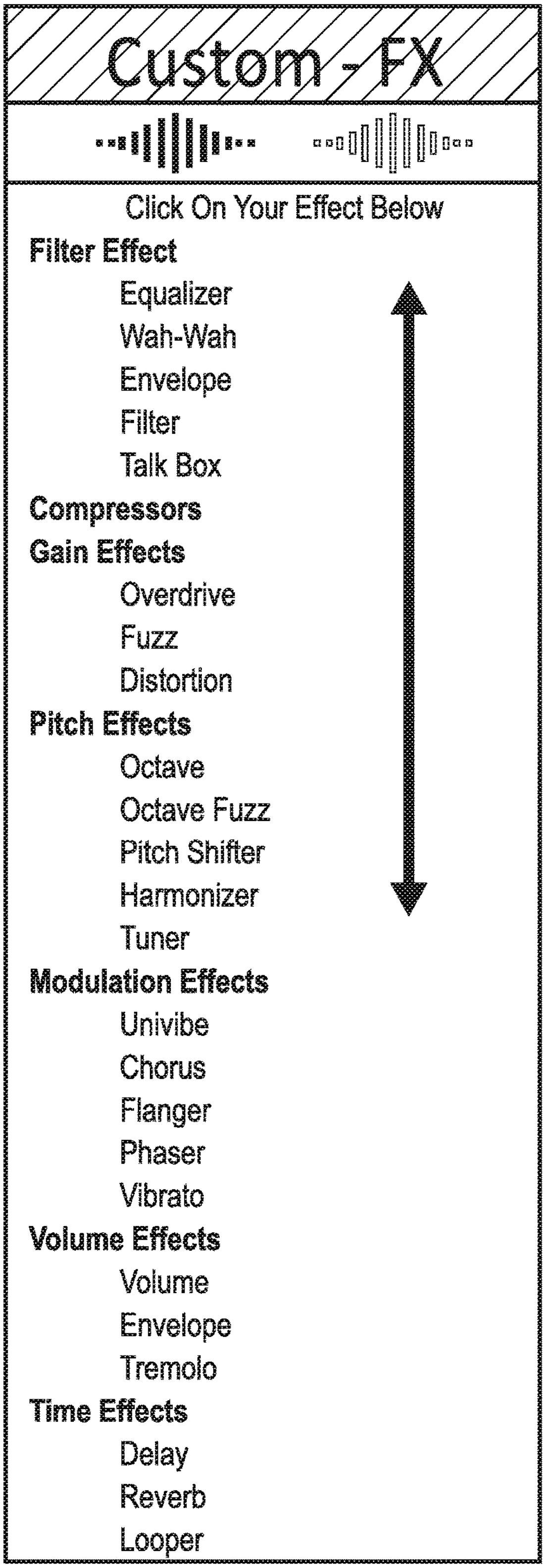
FIG. 37 is a twenty-sixth screenshot of the software application.
Figure 38:
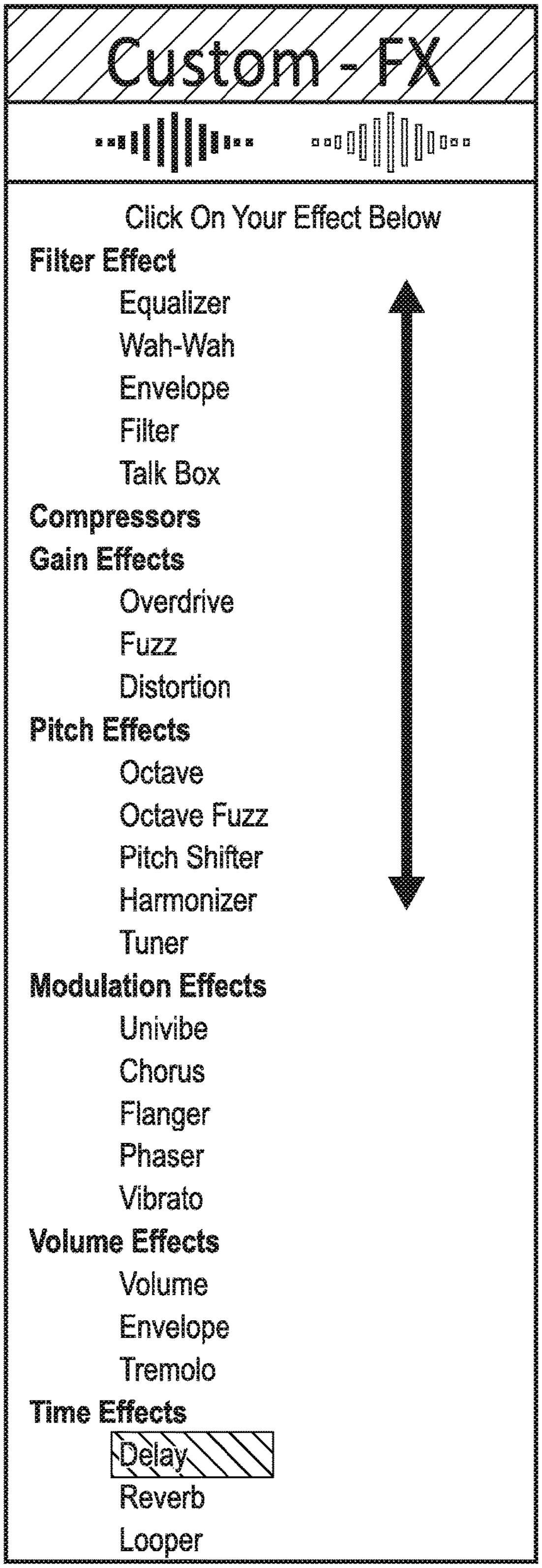
FIG. 38 is a twenty-seventh screenshot of the software application.
Figure 39:
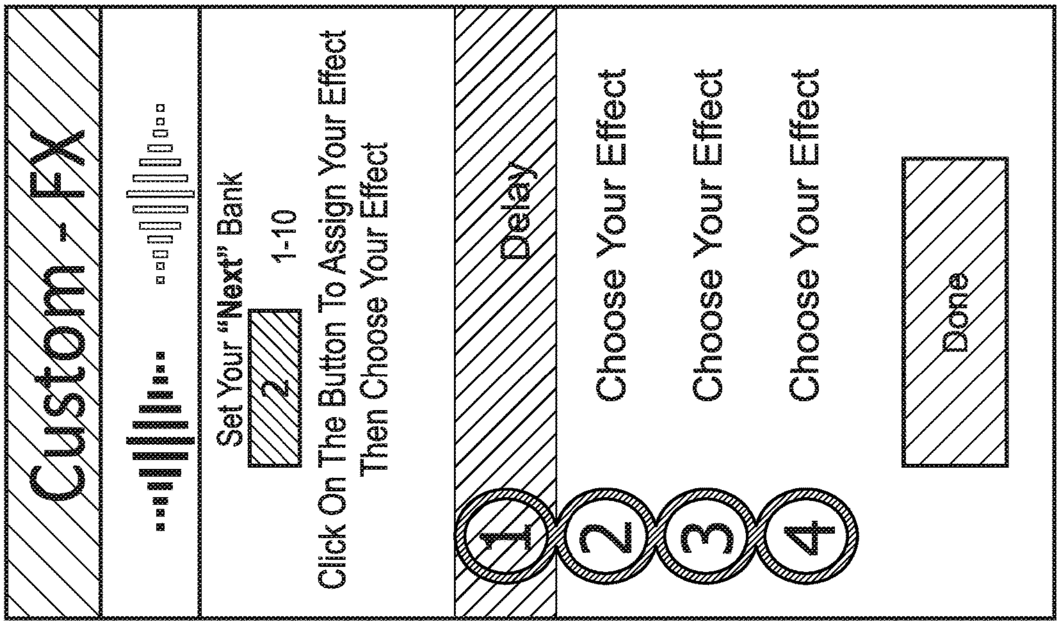
FIG. 39 is a twenty-eighth screenshot of the software application.
Figure 40:
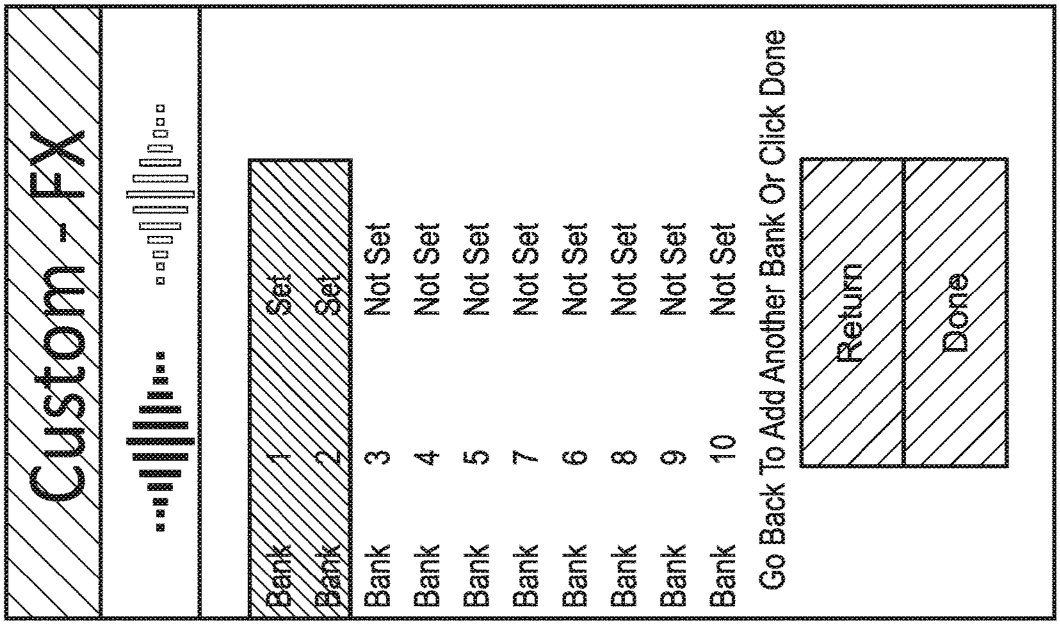
FIG. 40 is a twenty-ninth screenshot of the software application.

FIG. 36 shows that the user has entered bank 2 and selected effect slot 1 to set. FIG. 37 shows an example of the scrollable list of effects that would be available to set in the selected slot. FIG. 38 shows the effect "Delay" as the selected effect to be set in the selected slot. FIG. 39 shows the effects that have been set not only have extra shading but also have text indicating the effect that has been set in each respective effect slot. FIG. 40 shows that banks 1 and 2 have been set and the remaining banks (3-10) have not been set.

Figure 41:
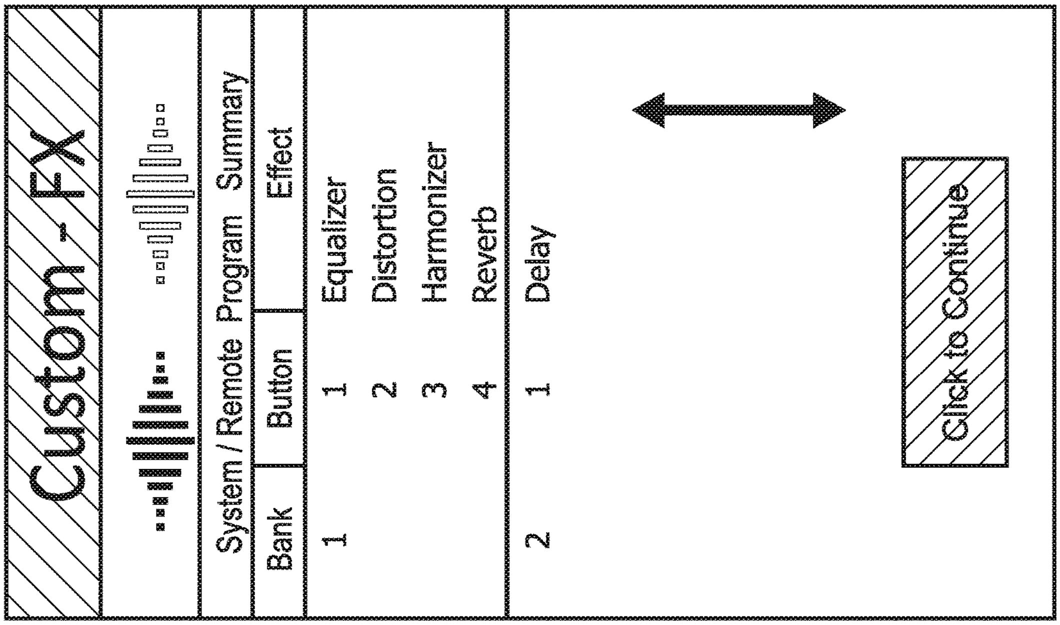
FIG. 41 is a thirtieth screenshot of the software application.
Figure 42:
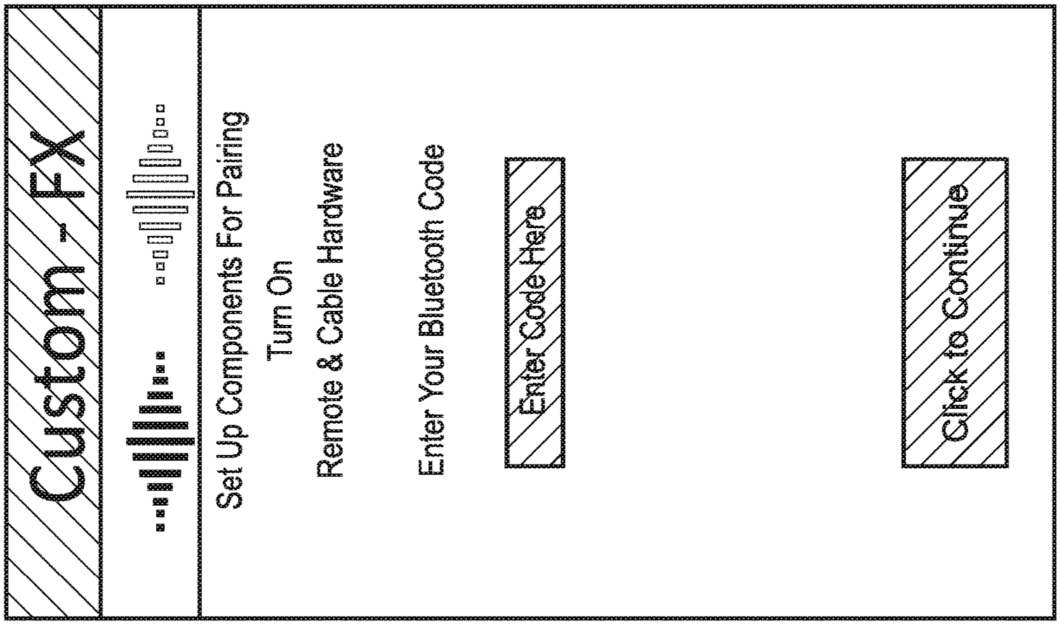
FIG. 42 is a thirty-second screenshot of the software application.
Figure 43:
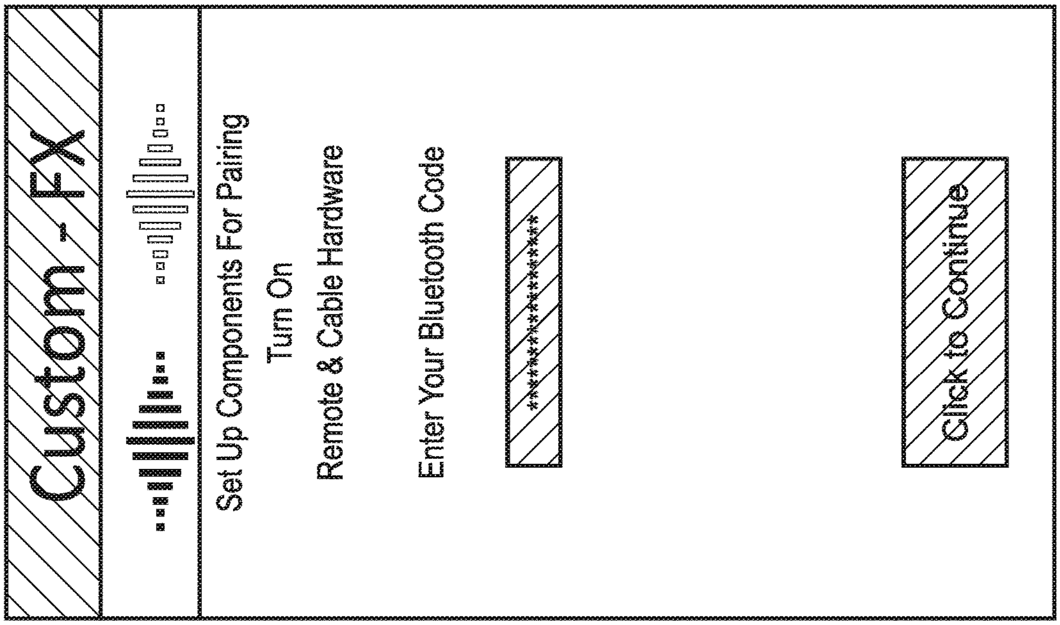
FIG. 43 is a thirty-third screenshot of the software application.
Figure 44:
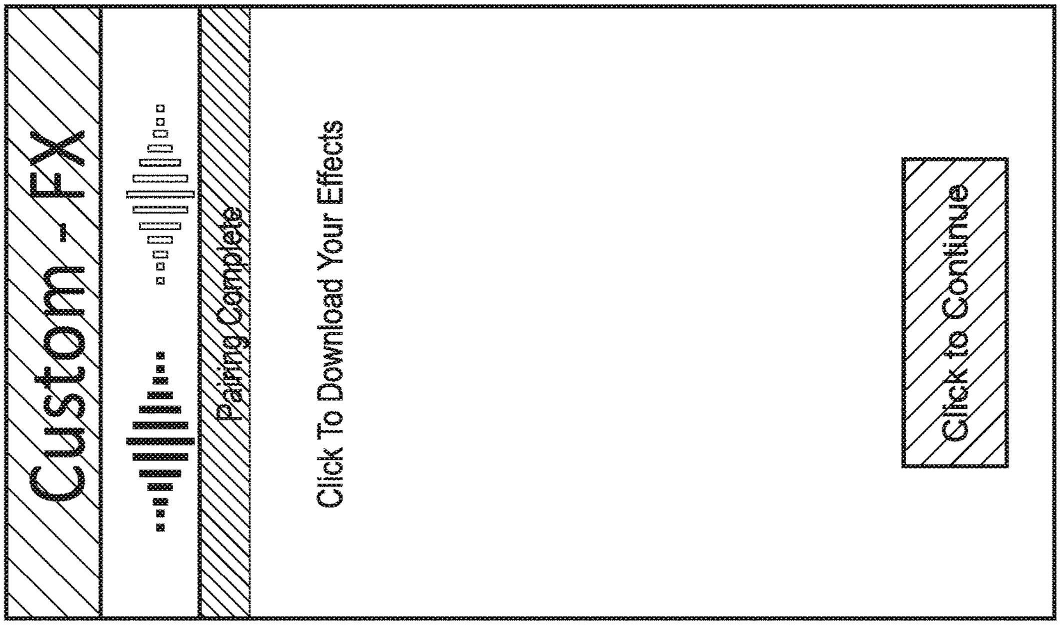
FIG. 44 is a thirty-fourth screenshot of the software application.
Figure 45:
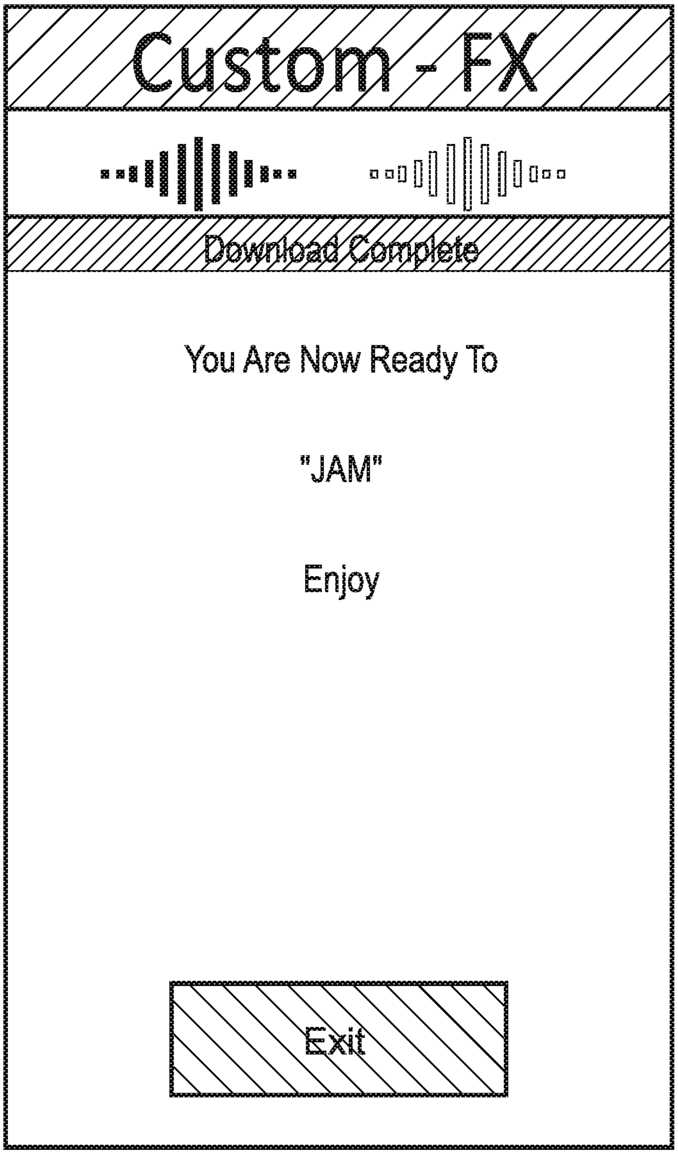
FIG. 45 is a thirty-fifth screenshot of the software application.

FIG. 41 shows the next screen if the user selected "Done" in FIG. 40, where a summary of the effects to be programmed on the special effects unit is displayed. FIG. 42 shows the next screen where the application provides the capability to connect via Bluetooth® communication to a wireless transceiver located within the special effects unit. FIG. 43 shows a code being entered to facilitate the Bluetooth® connection. FIG. 44 shows the pairing of the devices (the device using the software application and the special effects unit) is complete and indicating that the selected effects must be downloaded by clicking continue; this will program the special effects unit. FIG. 45 shows that the download is complete, indicating the special effects unit is ready to be used.

A group of one or more special effects, or algorithms, can be saved as a "grouping" or "bank" in the memory of the special effects unit. A user can access any grouped effects or algorithms in a "bank" or grouping playlist using the wireless controller and the software application. The software application is operatively arranged to allow the user to select which group, or "bank," of effects are desired. The wireless controller is operatively arranged to allow the user to toggle, on or off, each of the effects in the bank. One push button on the controller toggles one of the effects in the bank. A user can configure the embodiment so that outside automation signals—e.g., lighting controls, musical instrument digital interface (MIDI), or serial—trigger grouped effects or effect transitions.

A single effect, or algorithm can be saved in multiple user-assigned memory locations within the special effects unit or in removable memory. An algorithm can be configured in numerous ways and exist in numerous locations within the special effects unit. A user can access a single algorithm saved in different locations on the unit. After a user configures the unit, a user can toggle algorithms on and off with the wireless controller. A wireless controller can have any number of controls—e.g., buttons, levers, switches, touch screens, dials, wheels, knobs, or capacitive touch sensors—to manipulate one or more effects.

A user can access the software application to control a plurality of effects units. A plurality of units can communicate information to the software application regarding use of effects as well as the tone, key, notes, and chords being played by a user. Digital signal processing can be configured with a plurality of different circuits.

The special effects unit takes instrument level audio signal as input and applies the desired audio effects to the signal. The effects unit is interfaced using the software application via Bluetooth® communication, wherein a user can program the effects in real-time and modify the configuration of the buttons, effects, and parameters of the effects.

A preamplifier translates the audio signal from the input to 0-5V level such that the effects unit can utilize the entire full-scale (FS) for the input. The unit then executes the programmed signal processing on the audio signal to modify for the desired effect. Afterwards the output from the effects unit is filtered through a low-pass to remove the DC from the signal, and uses a post amplifier to amplify the voltage level back to a similar level of a typical electric guitar pickup.

The controller is the interface through which a user selects which effects are currently applied to the signal in real-time. In a preferred embodiment, the controller has a plurality of buttons, each representing a single effect that can be turned on or off with the button. Additionally, there is a knob that is used to navigate among the "banks" of effects in the memory of the effects unit and the software application. The effects change instantaneously when the user presses a button, with fewer than 10 milliseconds of latency. When a user presses a button, the wireless controls sends the command via Bluetooth® communication to the effects unit to control the desired effect, and the audio effect is applied to the output signal. A user can easily navigate between preprogrammed effects that exist in the memory of the effects unit.

| Parameter for Controller | | Additional Notes: |
|---|---|---|
| Bluetooth ® | | Connects to main device |
| Buttons | 4 instantaneous + 1 by-instantaneous | Each button sends a unique command to distinguish which button is being pressed |
| Latency | <10 ms | Must be low enough that it is perceived as instantaneous to the user and the listeners |

The limit for the High-Power Bus on the USB computer socket is typically 500 mA, whereas a wall plug can have any amount, 1-4 A is typical. In the case of phone chargers, it needs to be exactly 5 V or else it can damage the battery. The foregoing may be used with the present device.

There are three classes of USB functions with respect to power that can be derived from the port. First, the low-power bus-powered functions derive all of its power from the VBUS and must not draw more than 1-unit load (100 mA) according to the USB standard. It must also be able to work between the VBus voltage of 4.40V and 5.25V. Second, the high-power bus-powered functions derive all of its power from the VBus and cannot draw more than 100 mA until it is configured. Once configuration is confirmed, it can draw up to 5-unit loads (500 mA) by requesting it in its descriptor. At full load, it must be able to work between the VBus voltage of 4.75V and 5.25V. Third, self-powered functions can draw up to 100 mA from the VBus and the rest of its external source.

Technical specifications:

Input Channels (unbalanced): 1

Output Channels (unbalanced): 1

Input Impedance: 1 Mohm

Maximum INPUT signal level: 9 Vpp

Maximum OUTPUT signal level: 1 Vrms

Maximum CODEC input level: 1 Vrms

Most audio signals fall into one of four general groups in order of descending signal voltage level: speaker/headphone level, line level, instrument level, and microphone level. The goal in setting preamp gain is to either raise or lower the voltage to around 1 Vrms using the preamp stages. This gives the ideal signal level for the CODEC to obtain the best signal-to-noise ratio and sound fidelity. Instrument level signals are generally assumed to be from guitar pickups. Passive pickups can be as low as 20 mV. Humbuckers are much "hotter" and are often 100 mV to 400 mV. Active pickups are as high as several volts. Guitar pedals can also operate in the range of several volts.

Audio Input: Mono TS, unbalanced input. A user plugs his guitar into this jack. This will also work with line-level sources. When no plug is inserted, both channel inputs are grounded automatically. The input impedance is ~1 M, and the voltage max is 9V peak-to-peak.

Audio Output: Mono TS, unbalanced output. This is the analog output of the stereo codec's digital-to-analog converter (DAC). It is suitable to drive line-level, guitar pedal, or guitar amplifier inputs. The output impedance is ~100 Ohm, and the voltage range is 1.0V RMS.

Adverting to FIG. 10, the preamp gain switch selects the gain of the high-impedance preamp. Preamp gain is either 0 dB (unity) or +12 dB gain.

In a preferred embodiment, the sound effects are controlled by a microprocessor. The preferred microprocessor is TEENSY 3.2 powered by MK20DX256.

The software application must enable a user to configure the effects unit by allowing a user to perform the following: view his or her library of effects, copy an effect from the library to a bank and button location, remove an effect from a bank and button location, edit effect parameters in real time, save effect parameters, load effects into the product, and push new effect algorithms into the memory of the product. Parameters in the hardware that effect algorithms will be changed in real-time by the application, and a change in tone can be heard as adjustments are made in the application. Effects settings are saved in the hardware. Once the effects unit is configured, it can be used without the application; however, the effect parameters can only be edited using the application.

To download new effects from the marketplace, a user can access the effects store, which exists within the software application. A user can purchase a new effect in the software application, save the effect in his or her own library within the application, and send effects to the product via USB. Alternatively, these steps can be performed by the application if the features are compatible with mobile OS and transmitting new effect-algorithms via Bluetooth® communication instead of by USB. Including new effects as in-application purchases may be a drawback.

The developer environment is a simple interface for programming with digital service processor blocks. It includes the following: a standard for how an effect is structured, effects parameters, and a tool that packages the algorithm, parameters, and graphical user interface (GUI) into an effect. A developer can map effect parameters into an effect.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the figures attached hereto.

What is claimed is:

1. A special effects device for a musical instrument, comprising:

a special effects unit, comprising:

a transceiver;

a memory arranged to store a plurality of musical effect algorithms, wherein each algorithm is used to produce a different musical effect;

an input arranged to connect to a musical instrument;

an output arranged to connect an output device;

an external computing device having a software application arranged to store said plurality of musical effect algorithms, said external computing device arranged to transmit said plurality of musical effect algorithms to said memory of said special effects unit, said special effects device further comprising a controller operatively arranged to communicate to said transceiver to wirelessly control said special effects unit to selectively apply at least one of said plurality of stored musical effect algorithms to an audio signal provided to said special effects unit from said musical instrument.

2. The musical instrument special effects device recited in claim 1 wherein said output device is an amplifier.

3. The musical instrument special effects device recited in claim 1 wherein said output device is a sound mixing board.

4. The musical instrument special effects device recited in claim 1 wherein said output device is a computer.

5. The musical instrument special effects device recited in claim 1 wherein said output device is a pair of headphones.

6. The musical instrument special effects device recited in claim 1 wherein said musical instrument is a guitar.

7. A musical instrument special effects device, comprising:

a special effects unit connected by wire between said musical instrument and an output device, said unit operatively arranged to selectively produce at least one of a plurality of preprogrammed special audio effects;

a microcontroller operatively arranged to control said special effects device;

a pickup input operatively arranged to accept an analog musical signal from said musical instrument;

a pre-amp operatively arranged to bias said analog musical signal;

an analog to digital convertor operatively arranged to send digital signal to said microprocessor;

a digital to analog convertor filter operatively arranged to convert digital musical signal from said microprocessor to an analog musical signal;

an output bandpass filter operatively arranged to remove undesired distortions from said analog musical signal; and, a controller operatively arranged to wirelessly control said special effects unit.

8. The musical instrument special effects device recited in claim 7 wherein said microcontroller is operatively arranged to receive wireless commands from said controller, wherein said controller further comprises a wireless interface.

9. The musical instrument special effects device recited in claim 7 wherein said microcontroller further comprises a Bluetooth interface with smart phone.

* * * * *